(12) United States Patent
Mizukoshi et al.

(10) Patent No.: US 8,962,470 B2
(45) Date of Patent: Feb. 24, 2015

(54) METHOD FOR FORMING BUMPS, SEMICONDUCTOR DEVICE AND METHOD FOR MANUFACTURING SAME, SUBSTRATE PROCESSING APPARATUS, AND SEMICONDUCTOR MANUFACTURING APPARATUS

(75) Inventors: Masataka Mizukoshi, Kawasaki (JP); Yoshikatsu Ishizuki, Kawasaki (JP); Kanae Nakagawa, Kawasaki (JP); Keishiro Okamoto, Kawasaki (JP); Kazuo Teshirogi, Kawasaki (JP); Taiji Sakai, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 261 days.

(21) Appl. No.: 12/413,898

(22) Filed: Mar. 30, 2009

(65) Prior Publication Data

US 2009/0186425 A1    Jul. 23, 2009

Related U.S. Application Data

(60) Division of application No. 11/083,926, filed on Mar. 21, 2005, now abandoned, which is a continuation of application No. PCT/JP03/05092, filed on Apr. 22, 2003.

(30) Foreign Application Priority Data

Dec. 27, 2002    (JP) .................................. 2002-381582

(51) Int. Cl.
*H01L 21/44* (2006.01)
*H01L 23/00* (2006.01)
*H01L 21/48* (2006.01)

(52) U.S. Cl.
CPC ............ *H01L 24/29* (2013.01); *H01L 21/4853* (2013.01); *H01L 24/11* (2013.01);

(Continued)

(58) Field of Classification Search
None
See application file for complete search history.

(56) References Cited

U.S. PATENT DOCUMENTS 4,612,083 A * 9/1986 Yasumoto et al. ............. 438/59
4,676,868 A * 6/1987 Riley et al. .................... 438/697

(Continued)

FOREIGN PATENT DOCUMENTS

CN    2423655 Y    3/2001
EP    1 074 844 A2    2/2001

(Continued)

OTHER PUBLICATIONS

Patent Abstracts of Japan, Pub. No. 63152135 A, dated Jun. 24, 1988.

(Continued)

*Primary Examiner* — David E Graybill
(74) *Attorney, Agent, or Firm* — Westerman, Hattori, Daniels & Adrian, LLP

(57) ABSTRACT

A semiconductor substrate is secured by suction to a rear face of a supporting face of a substrate supporting table. In this event, the thickness of the semiconductor substrate is made fixed by planarization on the rear face, and the rear face is forcibly brought into a state free from undulation by the suction to the supporting face, so that the rear face becomes a reference face for planarization of a front face. In this state, a tool is used to cut surface layers of Au projections and a resist mask on the front face, thereby planarizing the Au projections and the resist mask so that their surfaces become continuously flat. This can planarize the surfaces of fine bumps formed on the substrate at a low cost and a high speed in place of CMP.

5 Claims, 27 Drawing Sheets

(52) U.S. Cl.
CPC .............. *H01L 24/27* (2013.01); *H01L 24/81* (2013.01); *H01L 24/83* (2013.01); *H01L 24/94* (2013.01); *H01L 24/13* (2013.01); H01L 2224/1134 (2013.01); H01L 2224/13099 (2013.01); H01L 2224/13144 (2013.01); H01L 2224/16145 (2013.01); H01L 2224/274 (2013.01); H01L 2224/48091 (2013.01); H01L 2224/48465 (2013.01); H01L 2224/749 (2013.01); H01L 2224/75 (2013.01); H01L 2224/75252 (2013.01); H01L 2224/81801 (2013.01); H01L 2224/83192 (2013.01); H01L 2224/83193 (2013.01); H01L 2224/838 (2013.01); H01L 2924/01005 (2013.01); H01L 2924/01011 (2013.01); H01L 2924/01013 (2013.01); H01L 2924/01015 (2013.01); H01L 2924/01018 (2013.01); H01L 2924/01029 (2013.01); H01L 2924/0103 (2013.01); H01L 2924/01047 (2013.01); H01L 2924/0105 (2013.01); H01L 2924/01078 (2013.01); H01L 2924/01079 (2013.01); H01L 2924/01082 (2013.01); H01L 2924/0781 (2013.01); H01L 2924/01006 (2013.01); H01L 2924/01019 (2013.01); H01L 2924/01033 (2013.01); H01L 2924/014 (2013.01); H01L 2924/0132 (2013.01); H01L 2924/0133 (2013.01); H01L 2224/48227 (2013.01); H01L 2224/29111 (2013.01); H01L 2224/13111 (2013.01); H01L 2924/00013 (2013.01)
USPC ............ 438/613; 438/614; 438/615; 438/617

(56) References Cited

U.S. PATENT DOCUMENTS

| | | | | |
|---|---|---|---|---|
| 4,818,728 | A * | 4/1989 | Rai et al. | 438/108 |
| 5,090,609 | A | 2/1992 | Nakao et al. | |
| 5,116,463 | A * | 5/1992 | Lin et al. | 216/18 |
| 5,118,385 | A * | 6/1992 | Kumar et al. | 216/18 |
| 5,132,878 | A * | 7/1992 | Carey | 361/778 |
| 5,156,997 | A * | 10/1992 | Kumar et al. | 438/614 |
| 5,167,361 | A * | 12/1992 | Liebman et al. | 228/180.22 |
| 5,173,442 | A * | 12/1992 | Carey | 216/18 |
| 5,188,280 | A | 2/1993 | Nakao et al. | |
| 5,202,754 | A * | 4/1993 | Bertin et al. | 257/684 |
| 5,219,787 | A * | 6/1993 | Carey et al. | 438/637 |
| 5,244,538 | A * | 9/1993 | Kumar | 216/18 |
| 5,254,493 | A * | 10/1993 | Kumar | 216/16 |
| 5,270,261 | A * | 12/1993 | Bertin et al. | 438/109 |
| 5,272,376 | A | 12/1993 | Ueno | |
| 5,290,732 | A * | 3/1994 | Kumar et al. | 216/13 |
| 5,312,514 | A * | 5/1994 | Kumar | 216/11 |
| 5,355,580 | A * | 10/1994 | Tsukada | 29/840 |
| 5,382,315 | A * | 1/1995 | Kumar | 216/39 |
| 5,419,806 | A * | 5/1995 | Huebner | 216/20 |
| 5,488,200 | A * | 1/1996 | Tsukada | 174/261 |
| 5,616,520 | A | 4/1997 | Nishiuma et al. | |
| 5,641,113 | A * | 6/1997 | Somaki et al. | 228/180.22 |
| 5,650,667 | A | 7/1997 | Liou | |
| 5,663,797 | A | 9/1997 | Sandhu | |
| 5,765,277 | A | 6/1998 | Jin et al. | |
| 5,786,271 | A | 7/1998 | Ohida et al. | |
| 5,839,187 | A | 11/1998 | Sato et al. | |
| 5,872,051 | A | 2/1999 | Fallon et al. | |
| 5,892,290 | A | 4/1999 | Chakravorty et al. | |
| 5,904,547 | A | 5/1999 | Flynn | |
| 5,924,003 | A * | 7/1999 | Slocum | 438/612 |
| 5,925,934 | A * | 7/1999 | Lim | 257/778 |
| 5,956,605 | A | 9/1999 | Akram et al. | |
| 6,063,646 | A * | 5/2000 | Okuno et al. | 438/107 |
| 6,063,647 | A | 5/2000 | Chen et al. | |
| 6,080,640 | A * | 6/2000 | Gardner et al. | 438/455 |
| 6,095,898 | A * | 8/2000 | Hennhofer et al. | 451/7 |
| 6,097,096 | A * | 8/2000 | Gardner et al. | 257/777 |
| 6,165,885 | A | 12/2000 | Gaynes et al. | |
| 6,168,972 | B1 * | 1/2001 | Wang et al. | 438/108 |
| 6,171,887 | B1 * | 1/2001 | Yamaji | 438/106 |
| 6,181,569 | B1 | 1/2001 | Chakravorty | |
| 6,220,499 | B1 * | 4/2001 | Brofman et al. | 228/180.22 |
| 6,225,206 | B1 | 5/2001 | Jimarez et al. | |
| 6,228,675 | B1 | 5/2001 | Ruby et al. | |
| 6,245,595 | B1 | 6/2001 | Nguyen et al. | |
| 6,260,264 | B1 | 7/2001 | Chen et al. | |
| 6,267,650 | B1 | 7/2001 | Hembree | |
| 6,271,588 | B1 | 8/2001 | Ohuchi | |
| 6,335,568 | B1 | 1/2002 | Yuzawa et al. | |
| 6,347,947 | B1 * | 2/2002 | Ong | 439/71 |
| 6,350,668 | B1 | 2/2002 | Chakravorty | |
| 6,416,386 | B2 | 7/2002 | Hembree | |
| 6,416,387 | B2 | 7/2002 | Hembree | |
| 6,416,388 | B2 | 7/2002 | Hembree | |
| 6,416,395 | B1 | 7/2002 | Hembree | |
| 6,416,397 | B2 | 7/2002 | Hembree | |
| 6,416,398 | B2 | 7/2002 | Hembree | |
| 6,416,399 | B2 | 7/2002 | Hembree | |
| 6,419,550 | B2 | 7/2002 | Hembree | |
| 6,422,919 | B2 | 7/2002 | Hembree | |
| 6,422,923 | B2 | 7/2002 | Hembree | |
| 6,425,516 | B1 | 7/2002 | Iwatsu et al. | |
| 6,428,393 | B1 | 8/2002 | Yukawa et al. | |
| 6,429,114 | B1 | 8/2002 | Hayama et al. | |
| 6,431,952 | B2 | 8/2002 | Hembree | |
| 6,476,503 | B1 * | 11/2002 | Imamura et al. | 257/780 |
| 6,503,127 | B2 | 1/2003 | Hembree | |
| 6,525,424 | B2 | 2/2003 | Murata et al. | |
| 6,534,419 | B1 * | 3/2003 | Ong | 438/759 |
| 6,543,267 | B2 | 4/2003 | Hembree | |
| 6,552,555 | B1 * | 4/2003 | Nuytkens et al. | 324/750.02 |
| 6,557,251 | B2 | 5/2003 | Hudson | |
| 6,661,085 | B2 * | 12/2003 | Kellar et al. | 257/686 |
| 6,664,637 | B2 | 12/2003 | Jimarez et al. | |
| 6,717,245 | B1 | 4/2004 | Kinsman et al. | |
| 6,724,084 | B1 * | 4/2004 | Hikita et al. | 257/737 |
| 6,756,680 | B2 | 6/2004 | Jimarez et al. | |
| 6,762,076 | B2 * | 7/2004 | Kim et al. | 438/107 |
| 6,780,669 | B2 | 8/2004 | Farnworth | |
| 6,780,746 | B2 | 8/2004 | Kinsman et al. | |
| 6,791,036 | B1 | 9/2004 | Chen et al. | |
| 6,830,460 | B1 * | 12/2004 | Rathburn | 439/66 |
| 6,875,683 | B2 | 4/2005 | Tong et al. | |
| 6,887,126 | B2 * | 5/2005 | Brouillette et al. | 451/6 |
| 6,893,069 | B1 | 5/2005 | Graham | |
| 6,908,784 | B1 * | 6/2005 | Farnworth et al. | 438/106 |
| 6,929,971 | B2 | 8/2005 | Murata et al. | |
| RE38,961 | E | 1/2006 | Okuno et al. | |
| 6,994,607 | B2 | 2/2006 | Wiswesser | |
| 7,021,521 | B2 | 4/2006 | Sakurai et al. | |
| 7,028,392 | B1 | 4/2006 | Schiebel | |
| 7,071,028 | B2 | 7/2006 | Koike et al. | |
| 7,089,160 | B2 * | 8/2006 | Nguyen | 703/2 |
| 7,157,787 | B2 * | 1/2007 | Kim et al. | 257/621 |
| 7,169,691 | B2 | 1/2007 | Doan | |
| 7,170,185 | B1 | 1/2007 | Hogerton et al. | |
| 7,198,544 | B2 | 4/2007 | Wiswesser | |
| 7,264,536 | B2 | 9/2007 | Wiswesser et al. | |
| 2001/0000057 | A1 | 3/2001 | Schindler | |
| 2001/0005600 | A1 * | 6/2001 | Ohuchi et al. | 438/106 |
| 2001/0029158 | A1 * | 10/2001 | Sasaki et al. | 451/66 |
| 2001/0039164 | A1 | 11/2001 | Hembree | |
| 2001/0039165 | A1 | 11/2001 | Hembree | |
| 2001/0041503 | A1 | 11/2001 | Hembree | |
| 2001/0041504 | A1 | 11/2001 | Hembree | |
| 2001/0041505 | A1 | 11/2001 | Hembree | |
| 2001/0041506 | A1 | 11/2001 | Hembree | |
| 2001/0041515 | A1 | 11/2001 | Hembree | |
| 2001/0041516 | A1 | 11/2001 | Hembree | |
| 2001/0041518 | A1 | 11/2001 | Hembree | |
| 2001/0044262 | A1 | 11/2001 | Hembree | |
| 2001/0046764 | A1 | 11/2001 | Ohuchi | |
| 2001/0046832 | A1 | 11/2001 | Hembree | |
| 2001/0053657 | A1 | 12/2001 | Hembree | |

(56) References Cited

U.S. PATENT DOCUMENTS

| | | | |
|---|---|---|---|
| 2002/0018591 A1* | 2/2002 | Murayama et al. | 382/150 |
| 2002/0027257 A1 | 3/2002 | Kinsman et al. | |
| 2002/0056741 A1* | 5/2002 | Shieh et al. | 228/180.5 |
| 2002/0066063 A1 | 5/2002 | Saunders et al. | |
| 2002/0111029 A1 | 8/2002 | Johnson | |
| 2002/0145198 A1 | 10/2002 | Murata et al. | |
| 2002/0149117 A1 | 10/2002 | Shibata | |
| 2002/0163072 A1* | 11/2002 | Gupta et al. | 257/698 |
| 2002/0177294 A1* | 11/2002 | Otaki | 438/612 |
| 2002/0185735 A1 | 12/2002 | Sakurai et al. | |
| 2003/0001283 A1* | 1/2003 | Kumamoto | 257/778 |
| 2003/0013286 A1* | 1/2003 | Palanisamy et al. | 438/586 |
| 2003/0057565 A1* | 3/2003 | Palanisamy et al. | 257/777 |
| 2003/0082852 A1 | 5/2003 | Fang | |
| 2003/0092253 A1* | 5/2003 | Yamaguchi | 438/613 |
| 2003/0099767 A1 | 5/2003 | Fang | |
| 2003/0155652 A1 | 8/2003 | Murata et al. | |
| 2003/0157782 A1* | 8/2003 | Kellar et al. | 438/455 |
| 2003/0164396 A1 | 9/2003 | Suga et al. | |
| 2003/0207651 A1 | 11/2003 | Kim et al. | |
| 2004/0009670 A1 | 1/2004 | Preusse et al. | |
| 2004/0014308 A1* | 1/2004 | Kellar et al. | 438/612 |
| 2004/0033758 A1 | 2/2004 | Wiswesser | |
| 2004/0040149 A1* | 3/2004 | Wood et al. | 29/852 |
| 2004/0082271 A1 | 4/2004 | Wiswesser et al. | |
| 2004/0238602 A1 | 12/2004 | Furuno et al. | |
| 2005/0167799 A1 | 8/2005 | Doan | |
| 2005/0266771 A1 | 12/2005 | Wiswesser | |
| 2006/0033118 A1 | 2/2006 | Lee et al. | |
| 2006/0189116 A1 | 8/2006 | Joshi et al. | |
| 2006/0279882 A1* | 12/2006 | Honda et al. | 360/324.12 |
| 2007/0034893 A1* | 2/2007 | Nakashima | 257/113 |
| 2007/0148918 A1 | 6/2007 | Kinsman et al. | |
| 2009/0186425 A1* | 7/2009 | Mizukoshi et al. | 438/7 |
| 2009/0215242 A1* | 8/2009 | Nitta | 438/427 |
| 2009/0219653 A1* | 9/2009 | Aoki et al. | 360/294.4 |

FOREIGN PATENT DOCUMENTS

| | | | | |
|---|---|---|---|---|
| JP | 55093003 A | * | 7/1980 | |
| JP | 1-164041 A | | 6/1989 | |
| JP | 4-037148 A | | 2/1992 | |
| JP | 5-315404 A | | 11/1993 | |
| JP | 7-66241 A | | 3/1995 | |
| JP | 07249732 A | * | 9/1995 | |
| JP | 7-297196 A | | 11/1995 | |
| JP | 7-326614 A | | 12/1995 | |
| JP | 8-148495 A | | 6/1996 | |
| JP | 10-135404 A | | 5/1998 | |
| JP | 11-40621 A | | 2/1999 | |
| JP | 11-274241 A | | 10/1999 | |
| JP | 11274241 A | * | 10/1999 | |
| JP | 2000-173961 A | | 6/2000 | |
| JP | 2000340590 A | * | 12/2000 | |
| JP | 2001-326251 A | | 11/2001 | |
| JP | 2001-332577 A | | 11/2001 | |
| JP | 2002223065 A | * | 8/2002 | |
| JP | 2003243816 A | * | 8/2003 | |
| JP | 2003258036 A | * | 9/2003 | |
| WO | WO 9214260 A1 | * | 8/1992 | |

OTHER PUBLICATIONS

Patent Abstracts of Japan, Pub. No. 0811049 A, dated Jan. 16, 1996.

Patent Abstracts of Japan, Pub. No. 09082616 A, dated Mar. 28, 1997.

Patent Abstracts of Japan, Pub. No. 2000021823 A, dated Jan. 21, 2000.

Patent Abstracts of Japan, Pub. No. 2000173954 A, dated Jun. 23, 2000.

Chinese Office Action dated Feb. 16, 2007, issued in corresponding Chinese patent application No. 03822757.6.

Japanese Decision of Refusal dated Dec. 2, 2008, issued in corresponding Japanese patent application No. 2004-564465.

* cited by examiner

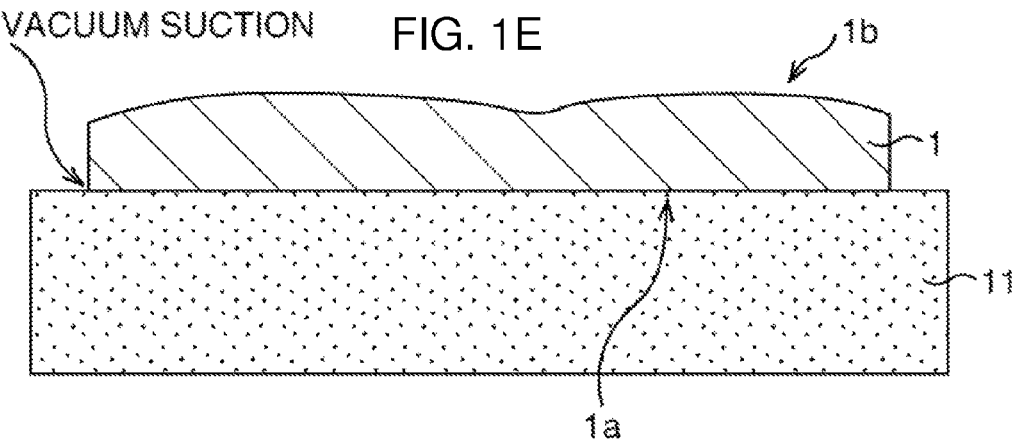
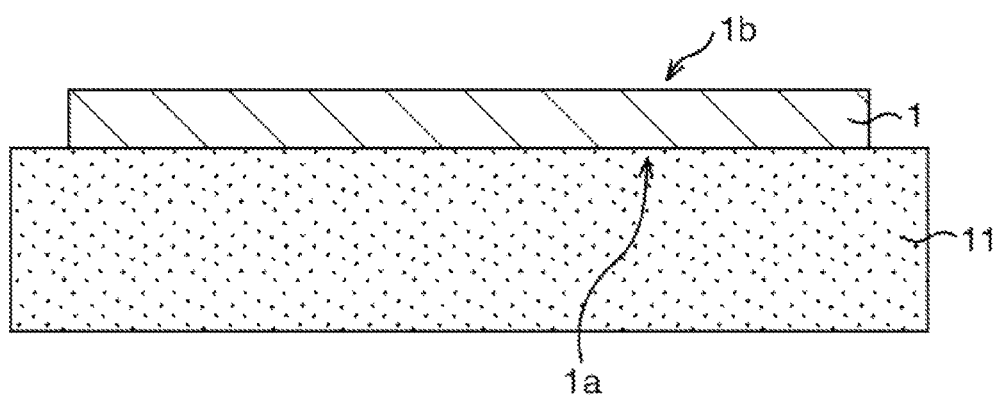

A PLURALITY OF SEMICONDUCTOR SUBSTRATES UNIFORMISED SAME THICKNESS t

FIG. 3A
FIG. 3B
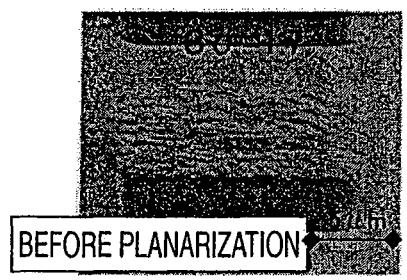
BEFORE PLANARIZATION
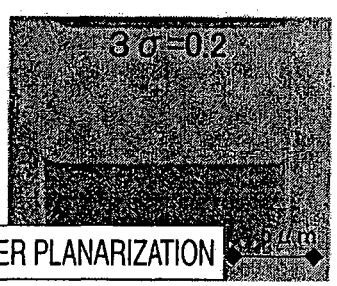
AFTER PLANARIZATION
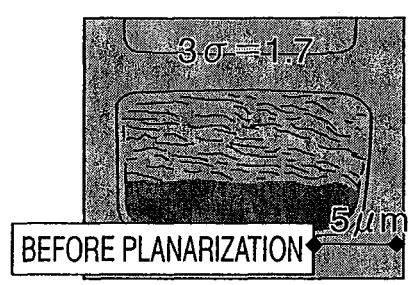
BEFORE PLANARIZATION
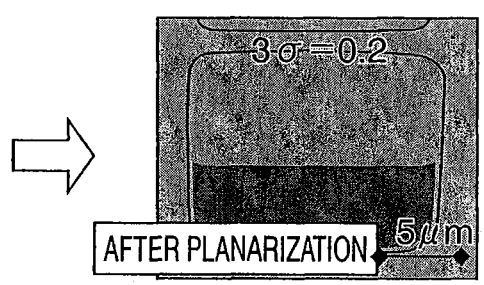
AFTER PLANARIZATION

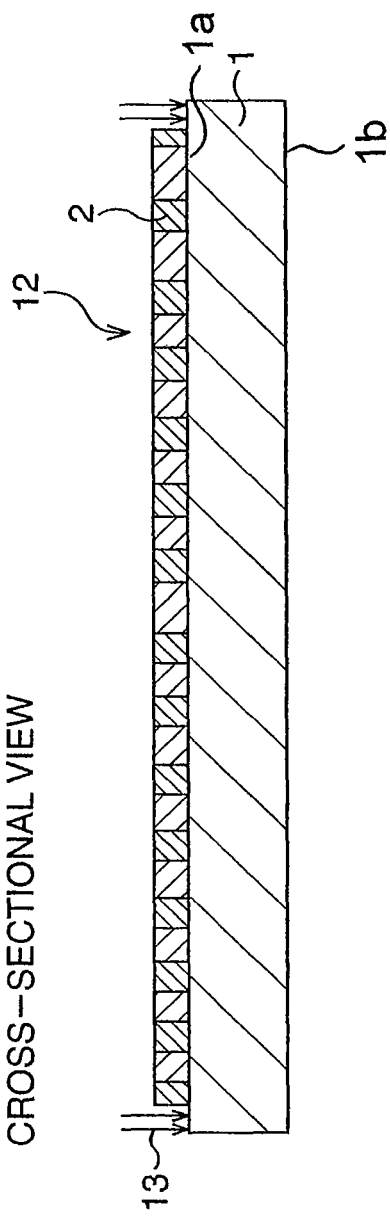
FIG. 4A  CROSS-SECTIONAL VIEW
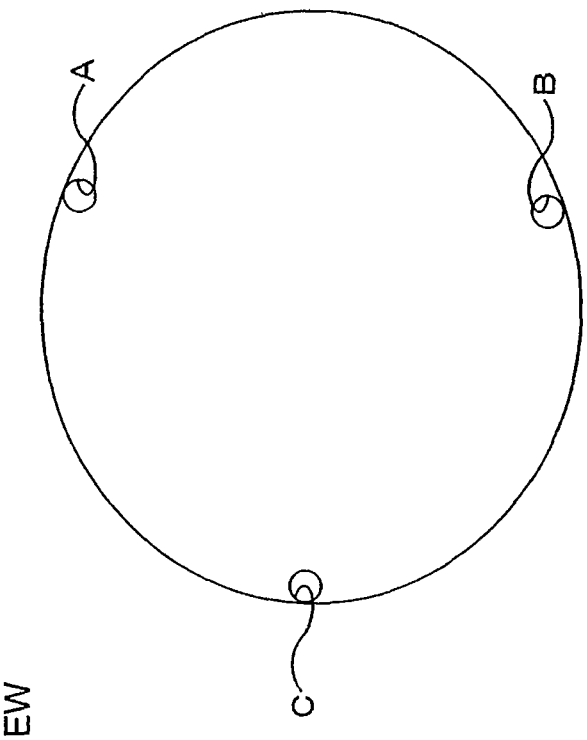
FIG. 4B  PLAN VIEW

FIG. 11A
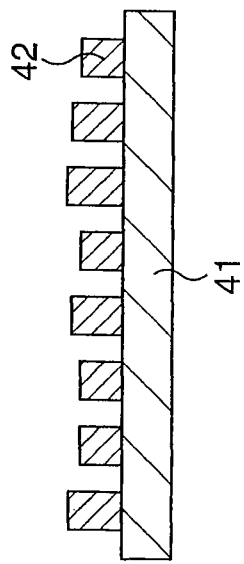
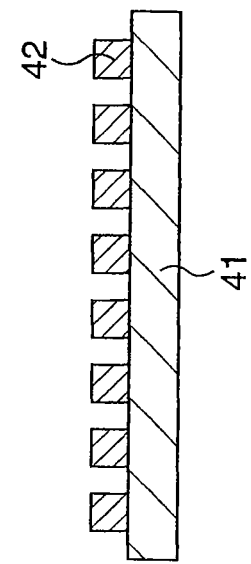

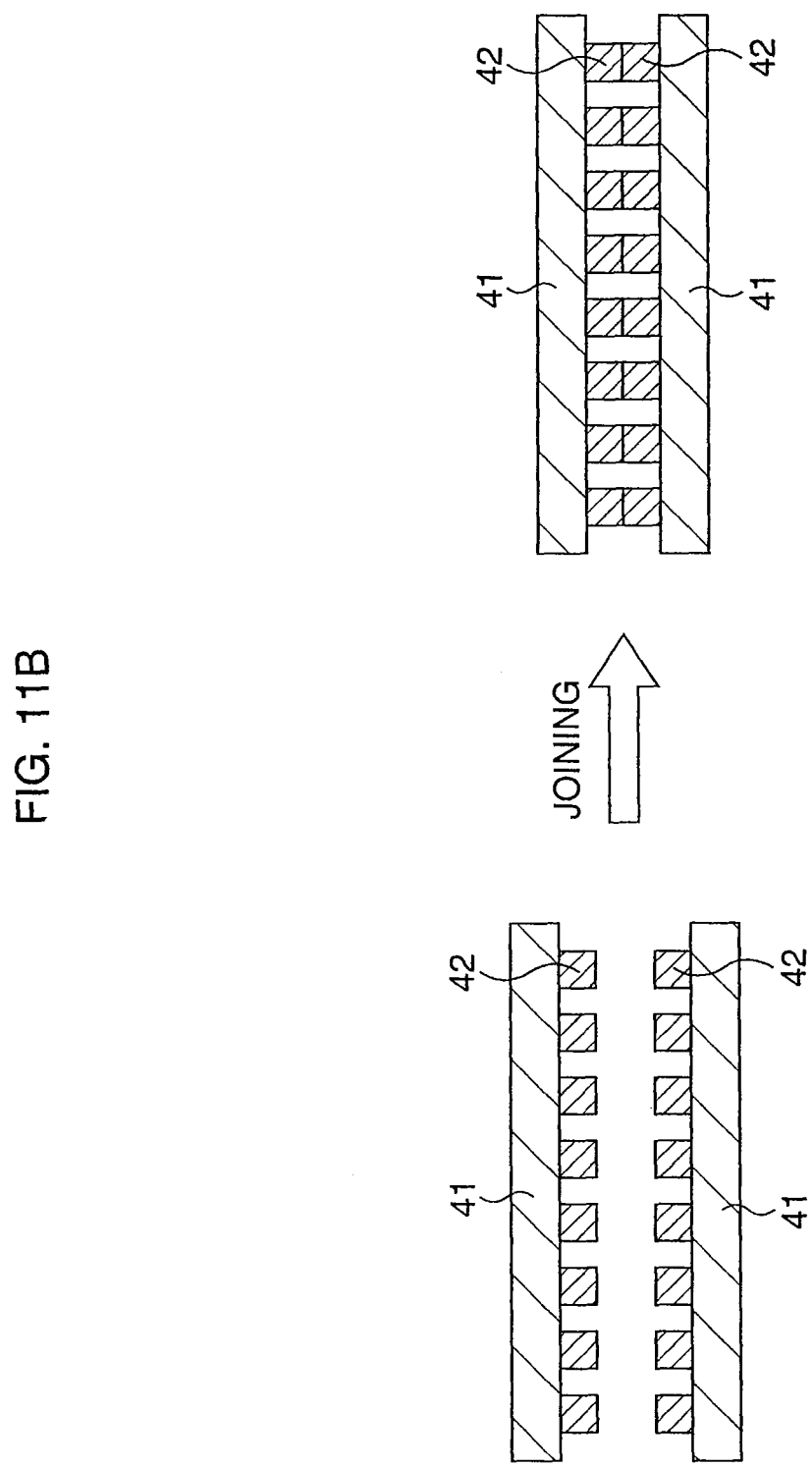

FIG. 12C
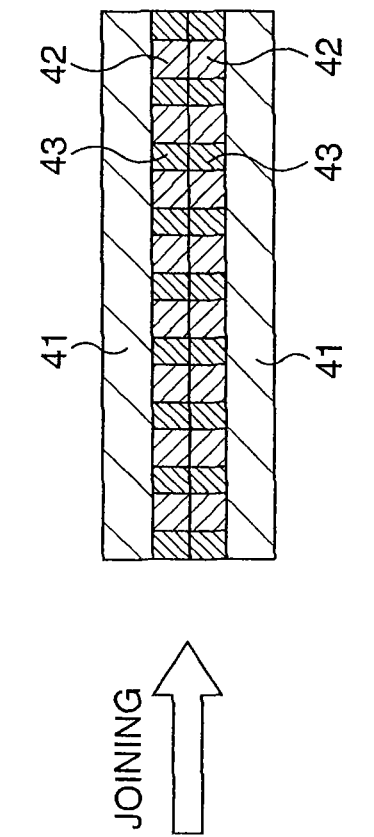
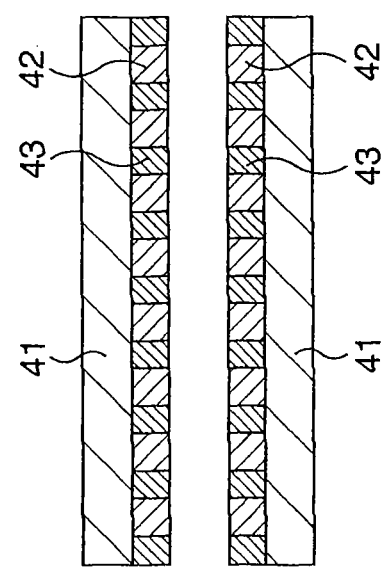

FIG. 13A
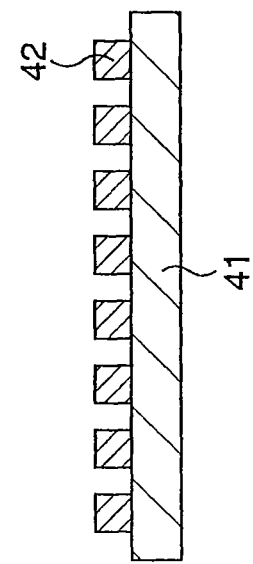
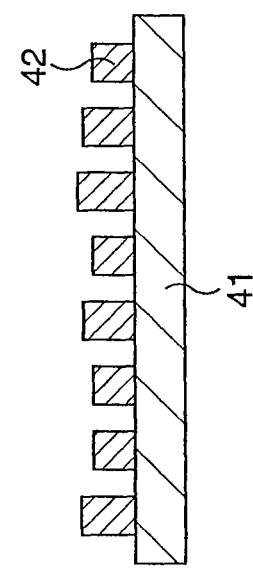

FIG. 13B
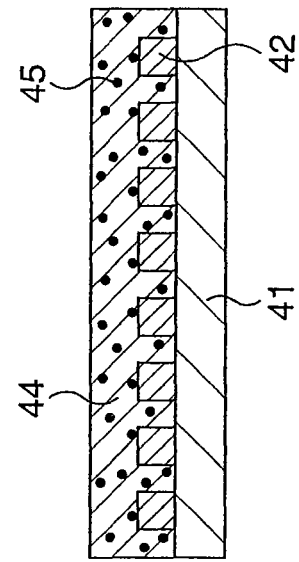
CONDUCTIVE RESIN LAYER FORMATION
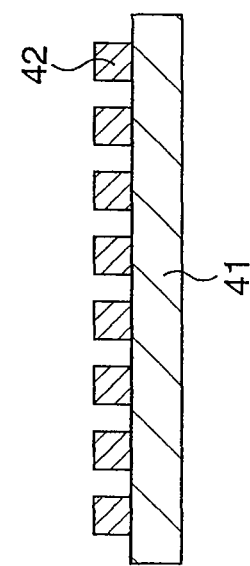

METHOD FOR FORMING BUMPS, SEMICONDUCTOR DEVICE AND METHOD FOR MANUFACTURING SAME, SUBSTRATE PROCESSING APPARATUS, AND SEMICONDUCTOR MANUFACTURING APPARATUS

CROSS-REFERENCE TO RELATED APPLICATIONS

This is a divisional application of U.S. patent application Ser. No. 11/083,926, filed on Mar. 21, 2005, currently pending, which is a continuation of International Application No. PCT/JP03/05092, filed on Apr. 22, 2003, which claims the benefit of priority from the prior Japanese Patent Application No. 2002-381582, filed on Dec. 27, 2002, the entire contents of which are incorporated herein by references.

TECHNICAL FIELD

The present invention relates to a method for forming on the front face of a substrate fine bumps for establishing an electrical connection with an external part, a semiconductor device and a method for manufacturing the same, a substrate processing apparatus, and a semiconductor manufacturing apparatus.

BACKGROUND ART

Conventionally, for a fine metal terminal for establishing an electrical connection with an external part on the front face of a semiconductor substrate, a gold (Au) bump or the like is used. This Au bump is formed by plating and thus has a large surface roughness. To planarize such a metal terminal, a chemical mechanical polishing (CMP) method is used. This method presses a flat polishing pad against a metal and a resin, which are faces to be processed have been formed relatively flat in advance, to planarize with high accuracy their surfaces chemically and mechanically using slurry (a chemical polishing agent). The CMP is finished at a stopper layer which is a rigid resin or a metal face provided in advance. The CMP method is a method not depending on a TTV (total thickness variation) that is defined by variations in thickness of a semiconductor substrate or by the difference between a maximum thickness and a minimum thickness of a semiconductor substrate.

Further, to join the Au bump or the like in the conventional art that has a large surface roughness, a mounting method is required that loads the bump with a load, heat, ultrasound, or the like until the roughness is eliminated.

In addition to the CMP, some other planarizing methods using, for example, a cutting tool have been devised (see, for example, Japanese Patent Application Laid-open No. Hei 7-326614, Japanese Patent Application Laid-open No. Hei 8-11049, Japanese Patent Application Laid-open No. Hei 9-82616, and Japanese Patent Application Laid-open No. 2000-173954). However, any of them aims to planarize an SOG film within a partial region on an LSI, and is a method of cutting with reference to a face to be cut, which does not depend on the TTV of a semiconductor substrate similarly to the CMP. Further, there is another method of exposing a surface of a bump by cutting (see Japanese Patent Application Laid-open No. 2000-173954 (Japanese Patent Application No. Hei 10-345201)), which aims to planarize a bump portion formed on an LSI, and is a method of cutting with reference to a face to be cut, which does not depend on the TTV of a semiconductor substrate.

As described above, the Au bump is used for fine connection, but it is difficult to join the bumps because of the large surface roughness of the bumps. Further, when the CMP is used to concurrently planarize a metal such as Au and a resin, a depression called dishing appears caused by the difference in polishing speed between the metal and the resin. Due to the dishing, it is necessary to load the bump with a load, heat, ultrasound, or the like to reliably join the bumps.

The present invention has been developed in consideration of the above-described problems, and has an object to provide, in place of the CMP, a method for forming bumps, which makes it possible to planarize surfaces of fine bumps formed on a substrate at a low cost and a high speed and to connect the bumps with each other easily and reliably without causing any inconvenience such as dishing or the like, a reliable semiconductor device and a method for forming the same, and a semiconductor manufacturing apparatus.

SUMMARY OF THE INVENTION

A method for forming bumps of the present invention is a method for forming on a front face of a substrate bumps for establishing an electrical connection with an external part, including the steps of: forming the plurality of bumps and an insulating film between the bumps on the front face of the substrate; performing planarization by cutting using a tool so that surfaces of the bumps and a surface of the insulating film become continuously flat; and removing the insulating film.

A semiconductor device of the present invention, includes: a pair of semiconductor substrates each having a plurality of bumps formed on a front face thereof for establishing an electrical connection with an external part, surfaces of the bumps being continuously uniformly planarized above each of the semiconductor substrates, and the semiconductor substrates being integrated, with the planarized surfaces of the bumps opposing each other and connected.

A method for manufacturing a semiconductor device of the present invention includes the steps of: forming bumps on each front face of a pair of semiconductor substrates in a manner to bury the bumps in an insulating film; performing planarization by cutting using a tool so that surfaces of the bumps and a surface of the insulating film become continuously flat; removing the insulating film; and integrating the semiconductor substrates, with the planarized surfaces of the bumps opposing each other and connected.

A method for forming bumps of the present invention is a method for forming on a front face of a substrate bumps for establishing an electrical connection with an external part, including the steps of: forming the plurality of bumps on the front face of the substrate; and performing planarization by cutting using a tool so that surfaces of the plurality of bumps become continuously flat.

A method for manufacturing a semiconductor device of the present invention includes the steps of: forming a plurality of bumps on each front face of a pair of semiconductor chips; performing planarization by cutting using a tool so that surfaces of the plurality of bumps become continuously flat; and integrating the pair of semiconductor chips having the plurality of bumps having the planarized surfaces, with the bumps connected opposing each other.

A semiconductor device of the present invention includes: a pair of semiconductor chips each having a plurality of bumps formed on a front face thereof for establishing an electrical connection with an external part, surfaces of the bumps being continuously uniformly planarized above each of the semiconductor chips, and the semiconductor chips being integrated, with the planarized surfaces of the bumps opposing each other and connected.

A method for forming bumps of the present invention is a method for forming on a front face of a semiconductor substrate stud bumps using a wire bonding method, the stud bumps being bumps for establishing an electrical connection with an external part, including the steps of: forming a plurality of projections using a bonding wire at electrical connecting points on the front face of the semiconductor substrate; and performing planarization by cutting using a tool so that top surfaces of the plurality of projections become continuously flat to thereby form the stud bumps.

A semiconductor device of the present invention includes: a semiconductor chip having a plurality of stud bumps formed on a front face thereof using a wire bonding method, the stud bumps being bumps for establishing an electrical connection with an external part, top surfaces of the plurality of stud bumps being continuously uniformly planarized above the semiconductor chip.

A method for manufacturing a semiconductor device of the present invention includes the steps of: forming a plurality of bumps on a front face of a semiconductor substrate; performing planarization by cutting using a tool so that surfaces of the plurality of bumps become continuously flat; cutting out each semiconductor chip from the semiconductor substrate having the plurality of bumps with the planarized surfaces; and connecting the bump of the semiconductor chip with one end portion of a lead terminal.

A method for manufacturing a semiconductor device of the present invention includes the steps of: forming a plurality of projections using a wire bonding method at electrical connecting points on a front face of a semiconductor substrate; performing planarization by cutting using a tool so that top surfaces of the plurality of projections become continuously flat to thereby form stud bumps; cutting out each semiconductor chip from the semiconductor substrate having the plurality of stud bumps formed thereon; and connecting the stud bump on the semiconductor chip with one end portion of a lead terminal.

A semiconductor device of the present invention includes: a semiconductor chip having a plurality of bumps formed on a front face thereof for establishing an electrical connection with an external part, surfaces of the bumps being continuously uniformly planarized above the semiconductor chip, and the bump on the semiconductor chip being integrally connected with one end portion of a lead terminal.

A semiconductor device of the present invention includes: a semiconductor chip having a plurality of stud bumps formed on a front face thereof using a wire bonding method, the stud bumps being a plurality of bumps for establishing an electrical connection with an external part, surfaces of the stud bumps being continuously uniformly planarized above the semiconductor chip, and the stud bump on the semiconductor chip being integrally connected with one end portion of a lead terminal.

A method for manufacturing a semiconductor device of the present invention includes the steps of: introducing a semiconductor chip having a plurality of electrodes formed on a front face thereof into an inert atmosphere and performing planarization by cutting using a tool so that surfaces of the plurality of electrodes become continuously flat; and integrally connecting the plurality of electrodes on the semiconductor chip and a circuit board in a state in which the planarized surfaces of the plurality of electrodes are kept clean in the inert atmosphere.

A semiconductor manufacturing apparatus of the present invention includes: a cutting unit having a tool; a joining unit joining a pair of bases introduced; and an inert atmosphere unit keeping an environment of the cutting unit and the joining unit in a state of an inert atmosphere, the cutting unit having a function of performing planarization by cutting using the tool at least on one of the pair of bases having a plurality of electrodes formed on front faces thereof in the inert atmosphere so that surfaces of the plurality of electrodes become continuously flat, and the joining unit having a function of integrating the pair of bases by connecting the plurality of electrodes in the state in which the planarized surfaces of the plurality of electrodes are kept clean in the inert atmosphere.

A substrate processing apparatus of the present invention is a substrate processing apparatus in forming on a front face of a substrate bumps for establishing an electrical connection with an external part, including: a substrate supporting table including a flat supporting face and vacuum-sucking one face of the substrate to the supporting face to forcibly support and secure the one face as a flat reference face; and a tool cutting another face of the substrate, wherein the substrate having the plurality of bumps and an insulating film between the bumps formed on the front face thereof is supported and secured on the supporting table, and subjected to planarization by the cutting using the tool so that surfaces of the bumps and a surface of the insulating film become continuously flat.

BRIEF DESCRIPTION OF THE DRAWINGS

FIG. 1A to 1F are schematic cross-sectional views showing a method for forming bumps according to a first embodiment in the order of steps;

FIG. 3A and FIG. 3B are views showing the result of planarization by cutting;

FIG. 4A and FIG. 4B are a schematic cross-sectional view and plan view showing a concrete example of the planarization by the cutting;

FIG. 11A and FIG. 11B are schematic cross-sectional views showing a method for manufacturing a semiconductor device according to a third embodiment in the order of steps;

FIG. 12A to FIG. 12C are schematic cross-sectional views showing a method for manufacturing a semiconductor device according to Modification 1 of the third embodiment in the order of steps;

FIG. 13A to FIG. 13C are schematic cross-sectional views showing a method for manufacturing a semiconductor device according to Modification 2 of the third embodiment in the order of steps;

DETAILED DESCRIPTION OF THE PREFERRED EMBODIMENTS

-Basic Gist of the Present Invention-

Figure 1A:
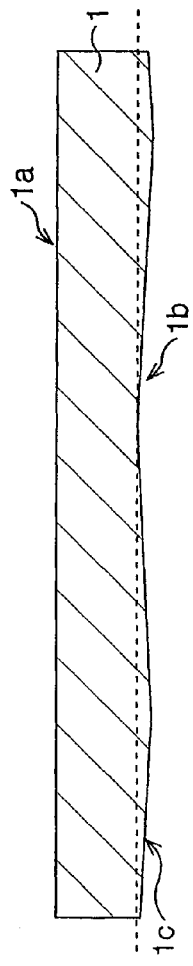

First of all, a basic gist of the present invention will be described.

The present inventor has devised application of cutting using a tool, in place of the CMP method, as a technique of planarizing the surfaces of a number fine bumps formed on a substrate at a time at a low cost and a high speed. This cutting, even in the case in which the bumps are formed buried in an insulating film on a semiconductor substrate, can continuously cut a metal and an insulator above the substrate at a time, unlike the CMP method which depends on the polishing speed or the like of the metal and the insulator, to thereby uniformly planarize both of them as a whole without causing inconvenience such as dishing or the like. Metals such as copper, aluminum, nickel, and the like and insulating materials such as polyimide and the like are materials which can be easily cut by the tool. In the present invention, it is preferable to employ as the metal material of the bumps and the insulating material, a ductile metal as the former and a resin or the like with a modulus of rigid of, for example, 200 GPa or higher as the latter.

In this case, to utilize the above-described cutting for planarizing the bump surface, the cutting is preferably performed with reference to a back face (a rear face) of the substrate. Generally, the TTV of a silicon substrate ranges from 1 µm to 5 µm, and a TTV of about 5 µm never affects photolithography in an LSI process and is thus generally left out of consideration. However, the cutting is greatly affected by the value of the TTV. The flatness accuracy by cutting never becomes equal to or less than the TTV value. Accordingly, when utilizing the cutting for planarizing the semiconductor substrate, it is first necessary to control the TTV of the substrate so that it falls within a target cutting accuracy.

In consideration of the above circumstances, the present inventor has devised a technique of cutting a rear face of a substrate with being secured at its front face to restrain the TTV of a semiconductor substrate so that it falls within the target cutting accuracy, as a concrete method of surely performing planarization of the bump surface when using the above-described cutting. In this case, it is ideal to decrease the TTV and restrain variations in thickness of an individual semiconductor substrate to within the cutting accuracy. However, if only the TTV can be decreased, the thickness of the individual semiconductor substrate can be detected during the cutting. The cutting amount is controllable by detecting the thickness of the individual semiconductor substrate.

Bumps include, in addition to a bump formed by the plating method, a bump formed by a wire bonding method, that is, by pressure-bonding a mass in a ball shape formed by melting the tip of a bonding wire onto an electrode pad and tearing off the wire (hereinafter referred to as a stud bump).

When forming the stud bump, a projection in a pin shape is formed by the tear of the bonding wire, and therefore that projection needs to be planarized. In the present invention, a planarizing method by the above-described cutting is also applied to the stud bump. In this case, projections vary in height during the tear (precut) of the wire, and the planarization is performed to align them with the lowest bump. However, the higher the stud bump is, the more the stud bump mitigates the stress on a device to increase the device life, and therefore it is necessary to define the height of the projections. In the present invention, the height of the projection from the electrode pad during the precut is defined to be double or more the wire diameter, and the point of time when the diameters of cut faces of all of the stud bumps become equal to or larger than the wire diameter is assumed as the end point of the cutting. This can make the height of the stud bump after the cutting planarization 1.5 times or more that when the wire diameter is not defined, thereby making it possible to mitigate the stress on a semiconductor element, resulting in increased device life.

Then, the TTV is controlled in the above-described manner, and the surfaces of the fine bumps are planarized by the cutting, and then the individual semiconductor chip which will be a semiconductor component is cut out from a semiconductor substrate (wafer). Thereafter, the semiconductor substrate with the planarized front face and the semiconductor chip, or the semiconductor chips are joined, with their bumps opposing each other and electrically connected. In this event, since both of the top surfaces of the opposing bumps are planarized with high accuracy, they are joined, unlike the conventional art, without requiring a high temperature, a high pressure, and so on.

Here the present inventor has further found concrete conditions and states for surely joining the opposing bumps. In consideration that it is ideal to keep the bumps in the planarized state immediately after the cutting even during the above-described joining, the present inventor has devised performance of both of the planarization step and the joining step in a cleaning atmosphere, specifically, in an inert atmosphere in order to keep as long as possible the planarized state immediately after the cutting. This can be addressed by addition of a cleaning step using Ar plasma or the like immediately before the joining step, which brings about a drawback, that is, an increase in the number of steps. In the present invention, the planarized state very close to the ideal state can be relatively easily maintained to ensure joining of the bumps without causing an increase in the number of steps.

The present inventor focuses attention on the state of the semiconductor chip as another aspect of the present invention. More specifically, the TTV of the semiconductor substrate is important as described above at a wafer level, whereas an individually separated semiconductor chip or the like is affected by the TTV within a chip area only to an almost negligible extent during cutting.

Hence, the present inventor has devised planarization in which each semiconductor chip is first cut out from the semiconductor substrate and then the surfaces of fine bumps are planarized in the state of the semiconductor chip by the above-described cutting using the tool. Then, the semiconductor chips are joined, with their bumps opposing each other and electrically connected. This can omit the step of controlling the TTV and easily join the bumps.

Further, in the present invention, the above-described cutting technique is also applied to a semiconductor device by a so-called TAB bonding method.

Generally, in the plating bump method, the TAB connection requires directly aligning with a gold plated bump a copper foil lead in a strip shape which has undergone surface treatment with gold, heating them to 300° C. or higher, and pressure-bonding with 30 g or greater per bump. On the other hand, in the case of using the stud bump method, it is required to press the semiconductor chip formed with stud bumps in advance against a glass plate or a metal plate and heat it to thereby process the tips of the stud bumps to be flat for use.

On plating end faces, there is specific metallic and organic contamination in depressions and projections and on its surface. Further, there occur variations in height of plating within a chip to a level of several microns. When the TAB bonding is performed for these plating end faces, a high temperature and a high load are required. The connection of leads with fine pitches is susceptible to positional displacement at a higher temperature during bonding because the difference in coefficient of thermal expansion between copper and silicon becomes larger. On the other hand, the stud bumps have large variations in height and their shapes are unfixed and thus require a much higher temperature and a higher load, so that connection with fine pitches is similarly difficult.

To decrease the positional displacement during the TAB bonding, it is necessary to lower the temperature and to bring copper lead terminals into contact with the bumps at the same time. In the present invention, the cutting technique through use of the tool can be used to planarize by the cutting the surfaces of the plated bumps and the stud bumps for cleaning them, thereby decreasing the temperature and the load during the TAB bonding so as to connect the leads with fine pitches without positional displacement.

-Concrete Embodiments of the Present Invention-

Hereinafter, based on the above-described basic gist, concrete embodiments of the present invention will be described in detail using the drawings.

[First Embodiment]

Here a silicon semiconductor substrate is illustrated as an example of a substrate to disclose a method for forming bumps provided on the semiconductor substrate to electrically connect to an external part, and a semiconductor device using this method and a method for manufacturing the same.

(Method for Forming Bump)

FIG. 1A to 1F, FIG. 2A, and FIG. 2B are schematic cross-sectional views showing a method for forming bumps according to this embodiment in the order of steps.

First, a silicon semiconductor substrate 1 is prepared, and desired LSI semiconductor elements (not shown) are formed within element formation regions on a substrate front face 1a. For the semiconductor substrate 1 on which the LSI semiconductor elements and the like are formed in this manner, steps will be described below.

As shown in FIG. 1A, the silicon semiconductor substrate is generally not uniform in thickness and has undulation as shown in the drawing. Hence, as a preceding step for performing later-described cutting using a tool for the front face 1a of the semiconductor substrate 1, its rear face 1b is planarized.

Figure 1B:
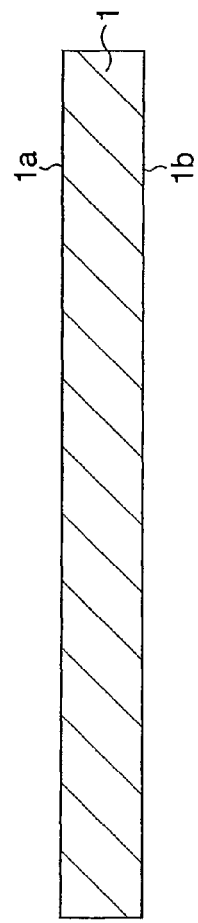

Specifically, as illustrated in FIGS. 1E and 1F, a substrate supporting table 11 having a supporting face made flat is prepared, and the front face 1a is sucked, for example, by vacuum suction to this supporting face so that the semiconductor substrate 1 is secured to the substrate supporting table. In this event, the front face 1a is forcibly made flat due to the suction to the supporting face, whereby the front face 1a becomes a reference face for planarization of the rear face 1b. In this state, machining, that is, mechanical-cutting here, is performed for the rear face 1b to cut and remove a protruding portion 1c on the rear face 1b for planarization. In this case, the amount of cutting the rear face 1b is preferably controlled based on the distance from the front face 1a. This controls the semiconductor substrate 1 so that its thickness becomes fixed, specifically the TTV (the difference between a maximum thickness and a minimum thickness of the substrate) being a predetermined value or less, specifically the TTV being 1μm or less as shown in FIG. 1B.

Figure 1C:
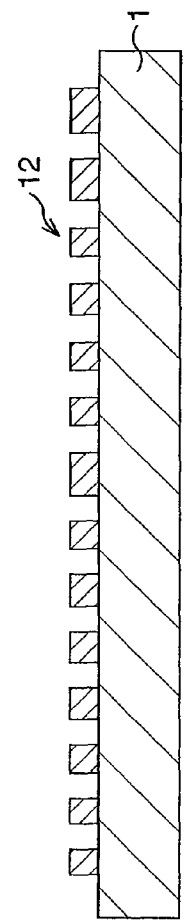

Subsequently, as shown in FIG. 1C, after the semiconductor substrate 1 is detached from the substrate supporting table, a photosensitive resin, for example, a photoresist is applied onto the front face 1a of the semiconductor substrate 1, and photolithography is employed to process the photoresist to form a resist mask 12 having predetermined bump patterns 12a.

Figure 1D:
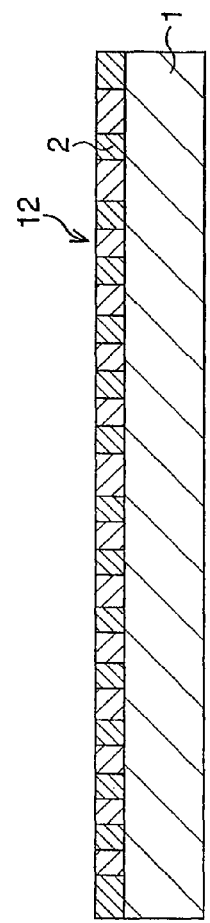

Subsequently, a metal, for example, a copper film is formed, for example, by a vapor deposition method using the resist mask 12 as a mask to form plated electrodes (not shown), and then gold (Au) is deposited using the plated electrodes as seeds to bury the bump patterns 12a of the resist mask 12 by the plating method, thereby forming Au projections 2 as shown in FIG. 1D. Note that Cu, Ag, Ni, Sn, an alloy of these, and so on as well as Au may be used to form the projections.

Subsequently, the front face 1a of the semiconductor substrate 1 is subjected to cutting using the tool for planarization.

Figure 2A:
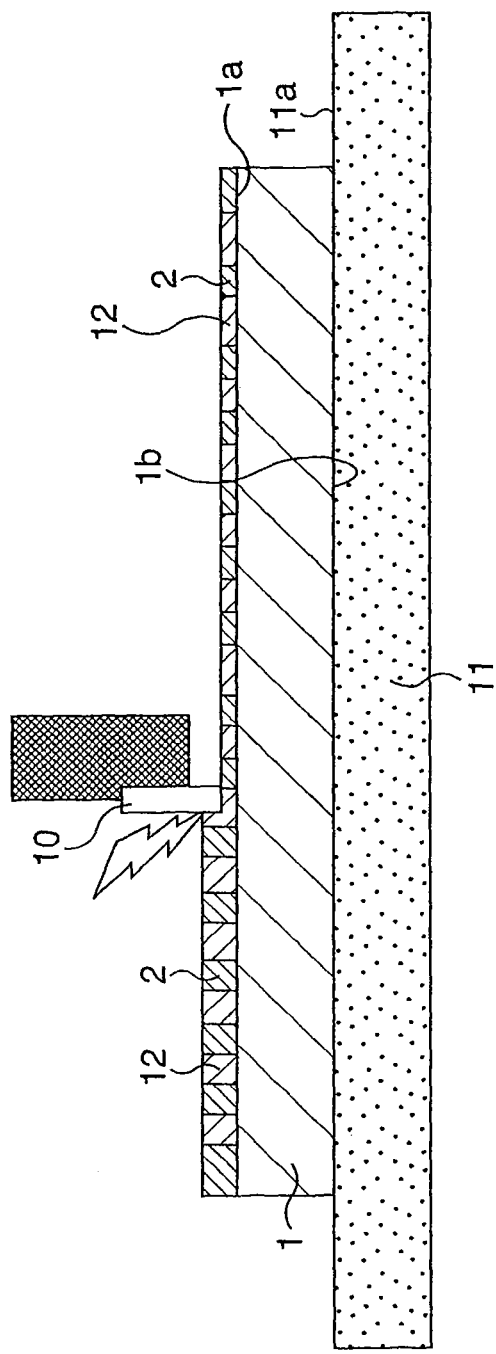
FIG. 2A to FIG. 2C are schematic cross-sectional views showing the method for forming bumps according to the first embodiment in the order of steps.

Specifically, as shown in FIG. 2A, for example, the rear face 1b is sucked, for example, by vacuum suction to a supporting face 11a of a substrate supporting table 11, whereby the semiconductor substrate 1 is secured to the substrate supporting table 11. In this event, the thickness of the semiconductor substrate 1 is fixed because of the planarization in FIG. 1B on the rear face 1b, and further the rear face 1b is forcibly brought into a state free from undulation and the like because of the suction to the supporting face 11a, whereby the rear face 1b becomes a reference face for planarization of the front face 1a. In this state, machining, that is, cutting using a tool 10 made of diamond or the like here, is performed for surface layers of the Au projections 2 and the photoresist 12 on the front face 1a to thereby planarize them so that the surfaces of the Au projections 2 and the resist mask 12 become continuously flat. This planarizes the top surfaces of the Au projections 2 into mirror surfaces.

The result of the planarization by the cutting is shown in microphotographic views and schematic views in FIG. 3A and FIG. 3B.

It is found that the surface of the Au projection is uneven as in FIG. 3A before the cutting, whereas the surface of the Au projection is planarized with high accuracy as shown in FIG. 3B after the cutting.

Figure 2B:
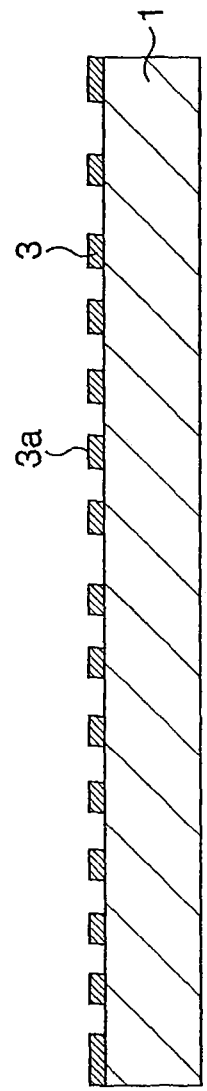

Subsequently, as shown in FIG. 2B, the resist mask 12 is removed by ashing or the like. In this event, bumps 3 having a uniform height and top surfaces 3a uniformly planarized which are formed by cutting the Au projections 2, are formed on the front face 1a of the semiconductor substrate 1. This semiconductor substrate 1 is cut into a chip and electrically connected with another semiconductor substrate 4 via the bumps 3.

Figure 2C:
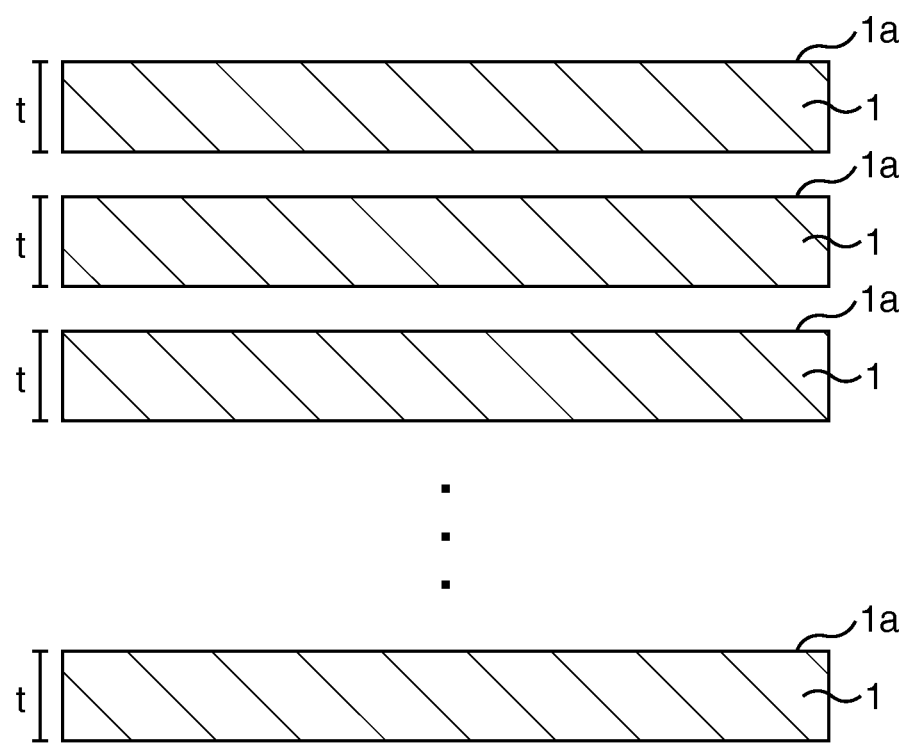

Note that although one semiconductor substrate is described in this embodiment, it is preferred to perform the steps of this embodiment for a plurality of semiconductor substrates constituting a lot, to uniformize the semiconductor substrates so that they have the same thickness, as shown in FIG. 2C.

Further, control in the planarization step in FIG. 2A is performed by correcting parallelism of the semiconductor substrate 1 with reference to the rear face 1b and detecting a position of the front face 1a to calculate the cutting amount from the detected front face 1a as shown in FIG. 4A and FIG. 4B.

Specifically, it is preferred, when detecting the position of the front face 1a, to apply laser light 13 to the resist mask 12, as shown in FIG. 4A, at a plurality of points within a peripheral region of the front face 1a of the semiconductor substrate 1, for example, three points A, B, and C shown in FIG. 4B here, and to heat and scatter the resist mask 12 there to thereby expose portions of the front face 1a.

Figure 5:
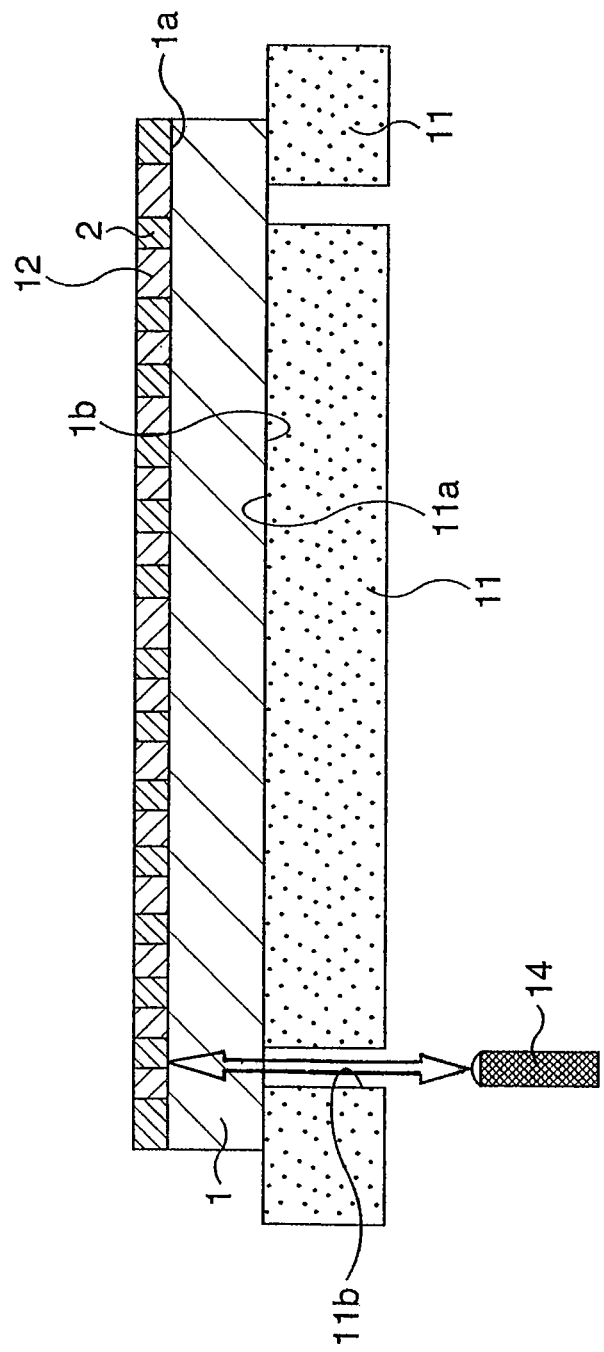
FIG. 5 is a schematic cross-sectional view showing a concrete example of the planarization by the cutting.

In this case, when detecting the position of the front face 1a, it will be preferable to fix by suction the semiconductor substrate 1 to the substrate supporting table 11 formed with an opening 11b as shown in FIG. 5, and to irradiate infrared laser light to the rear face 1b through the opening 11b and measure reflected light from the front face 1a, for example, by an infrared laser measuring instrument 14. The infrared laser light emitted from the infrared laser measuring instrument 14 and the infrared laser ling reflected from the front surface 1a are shown by a double-headed arrow.

(Configuration of Cutting Apparatus)

Here a concrete apparatus configuration for performing the above-described cutting step will be described.

Figure 6:
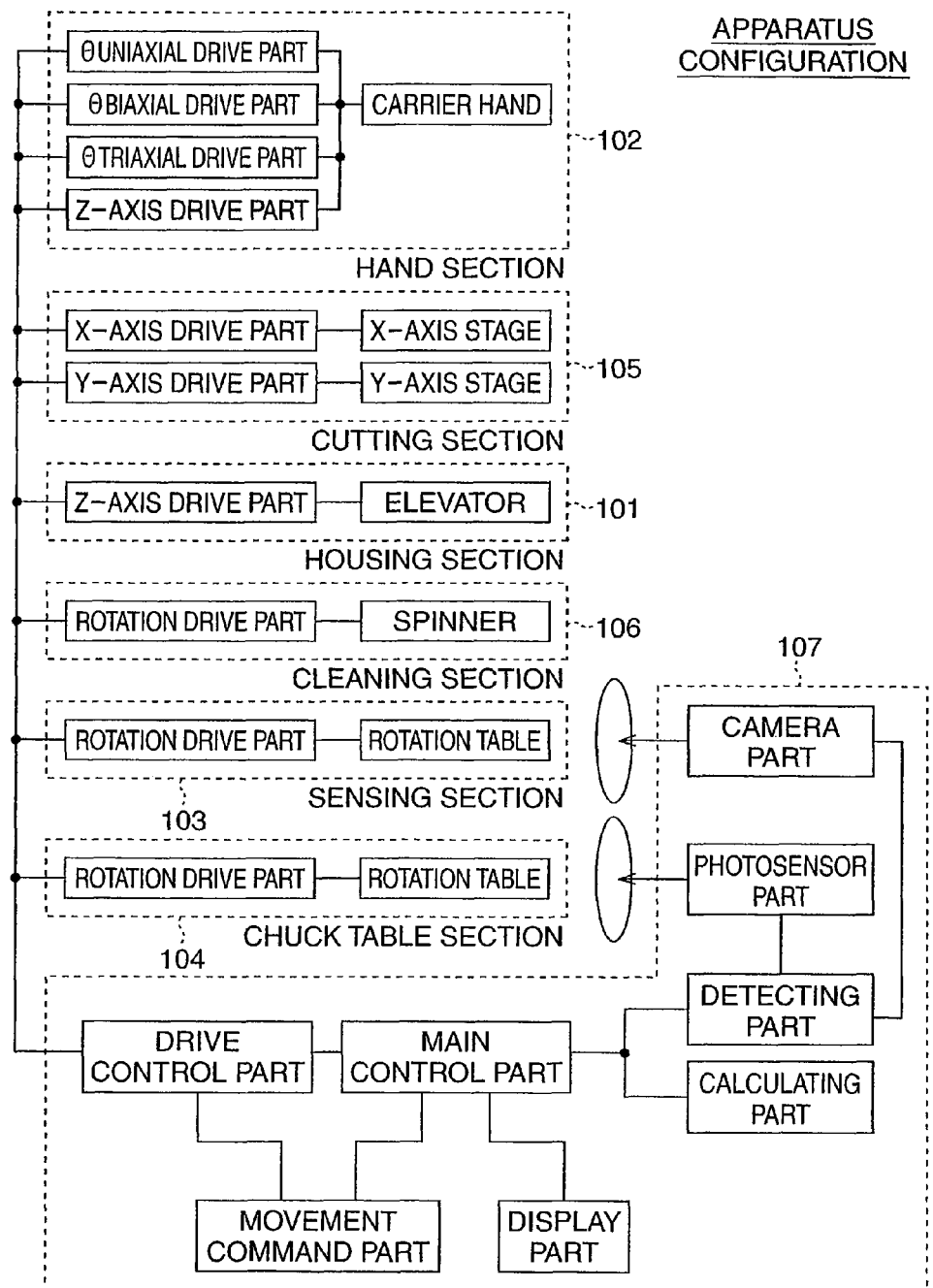
FIG. 6 is a block diagram showing a configuration of a cutting apparatus.
Figure 7:
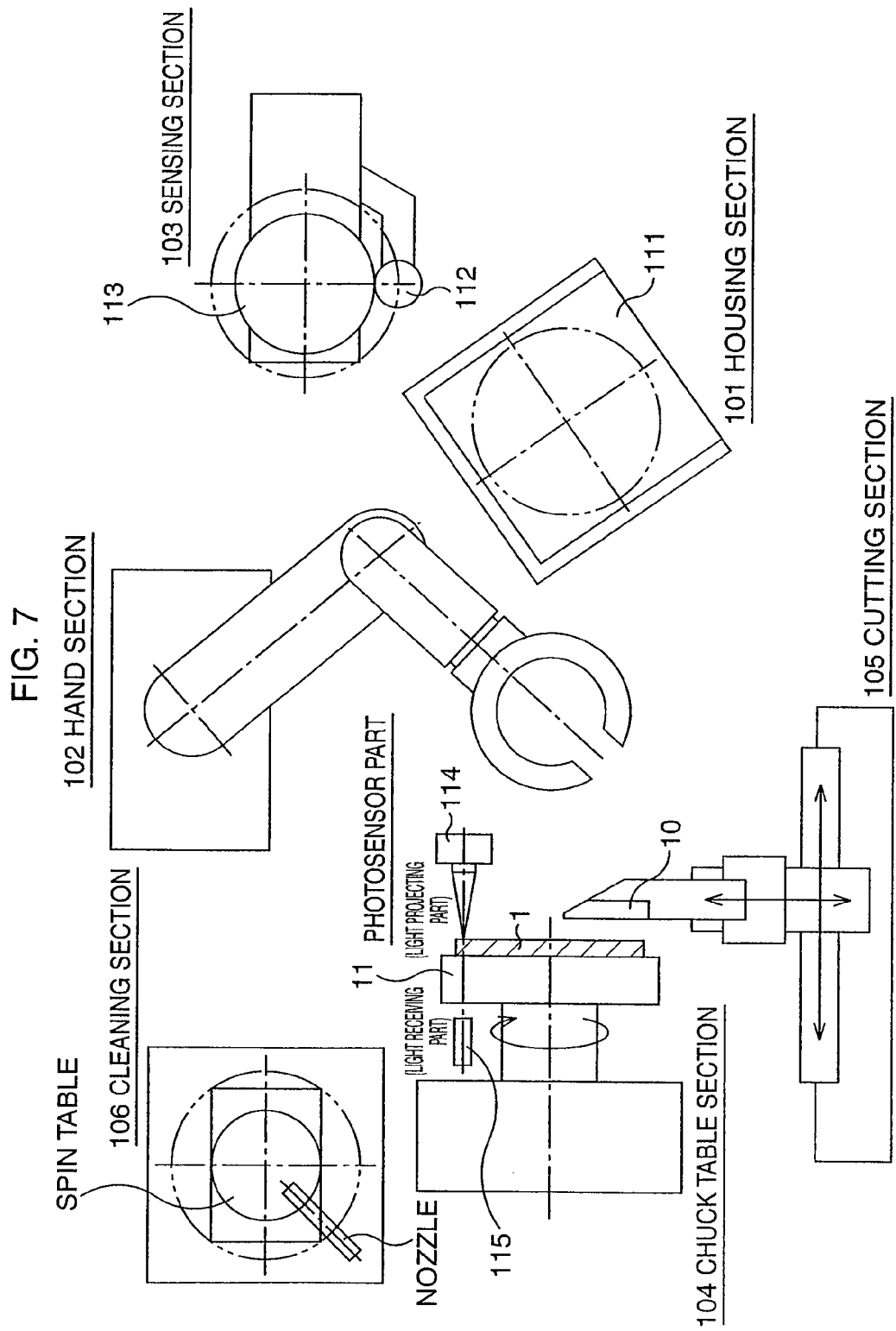
FIG. 7 is a schematic configuration diagram of the cutting apparatus.

FIG. 6 is a block diagram showing a configuration of the cutting apparatus, and FIG. 7 is a similar schematic configuration diagram. This cutting apparatus constructed having a housing section 101 which houses a semiconductor substrate; a hand section 102 (handling unit) for carrying the semiconductor substrate 1 to each processing unit; a sensing section 103 which positions the semiconductor substrate 1; a chuck table section 104 which chucks the semiconductor substrate 1 during cutting; a cutting section 105 which performs planarization cutting of the semiconductor substrate 1; a cleaning section 106 which performs cleaning after the cutting; and a control section 107 (control unit) which controls these sections. The chuck table section 104 constitutes the substrate supporting table (chuck table) 11 which mounts thereon and secures the semiconductor substrate 1 as described above, and the cutting section 105 has a rigid tool 10 that is a cutting tool made of diamond or the like.

Figure 8:
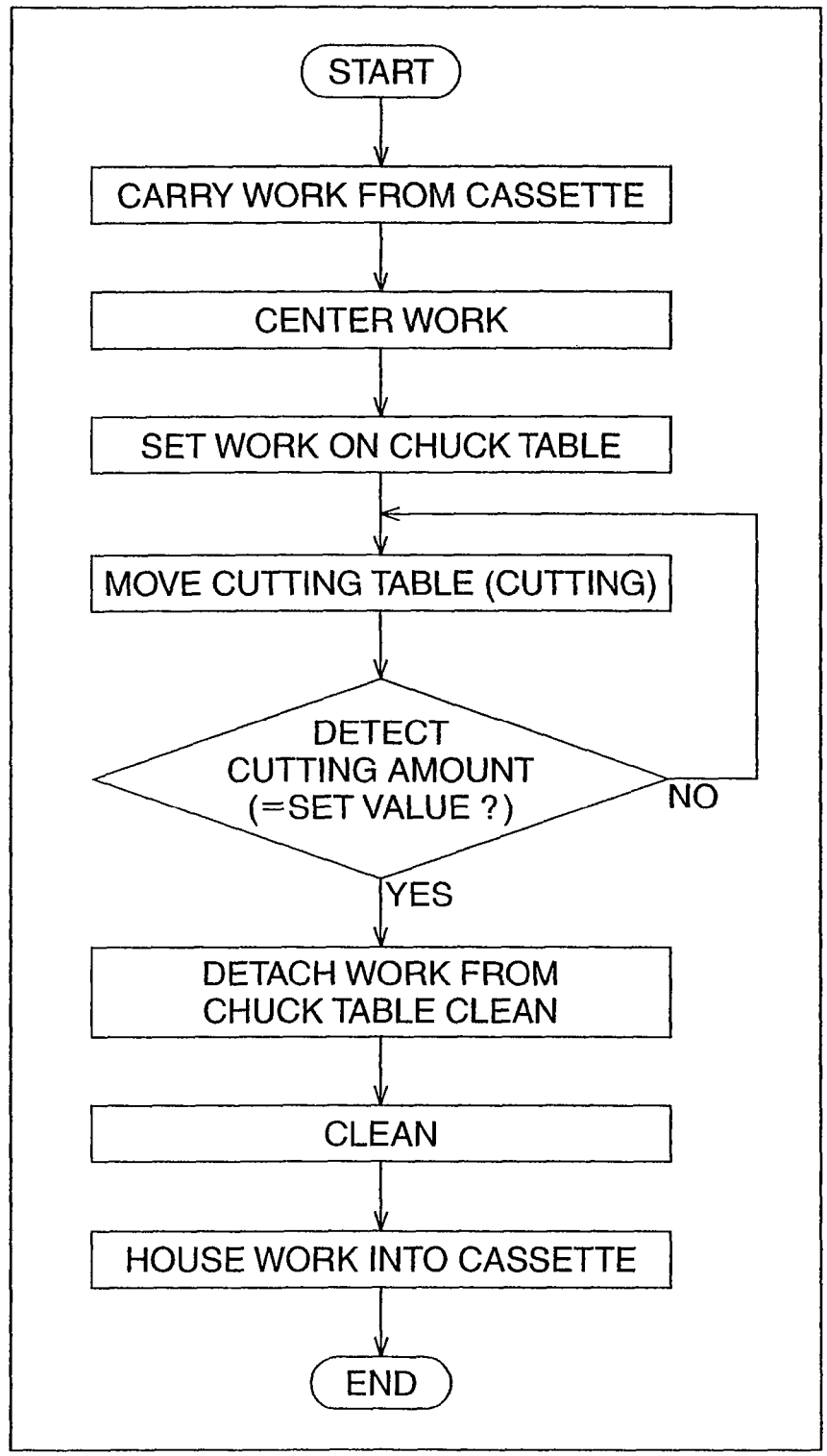
FIG. 8 is a flowchart of cutting steps.

Next, the flow of the cutting step is described using FIG. 7 and FIG. 8.

First, a carrier hand of the hand section 102 takes out the semiconductor substrate 1 from a housing cassette 111 of the housing section 101 in which the semiconductor substrate 1 is housed. In the housing section 101, an elevator mechanism is provided and rises/lowers to a level where the carrier hand takes out the semiconductor substrate 1. Next, the carrier hand vacuum-sucks the semiconductor substrate and carries it to the sensing section 103. The carrier hand is a Θ three axes and Z-axis SCARA-type robot and can easily realize handling to each processing unit. The mechanism of the robot is not limited to this, but an X- and Y-axes orthogonal-type is also employable.

In the sensing section 103, the semiconductor substrate 1 is rotated 360° by a rotation table 113, and a CCD camera 112 captures an image of the outer periphery of the semiconductor substrate 1, so that a calculating part of the control section 107 processes the result to calculate the center position of the semiconductor substrate 1.

Next, the carrier hand corrects the position based on the result and carries the semiconductor substrate 1 to the chuck table section 104, and the chuck table 11 secures it by vacuum. This chuck table 11 becomes a reference face for processing. Therefore, to maintain the planar accuracy during the securing and processing, the chuck face is preferably made of a porous material and has a structure to chuck the entire face of the semiconductor substrate 1. The quality of the material used is metallic, ceramic, resin, or the like. Opposite the chucked semiconductor substrate 1, a photosensor part being a light projecting part 114 is located to measure and calculate the dimensions of the semiconductor substrate 1 in cooperation with a camera part being a light receiving part 115 and feed the result back to an X-axis drive part of the cutting section 105 to thereby issue a command for the moving amount for cutting.

When the face to be cut is a face to be formed with a wire, it is concretely preferred to apply laser light thereto to heat and scatter the resist mask as shown in FIGS. 4A and 4B, thereby exposing the surface. Then, a transmission-type sensor utilizing an infrared laser beam is used to measure the position as shown in FIG. 5. Based on the result calculated there, the table, on which the tool 10 which actually performs cutting is mounted, moves in the X-direction, and then cutting is started. The tool 10 used here is made of diamond or the like. In this way, the cutting to the set dimensions is completed.

Next, the carrier hand detaches the semiconductor substrate 1 from the chuck table 11 and carries it to the cleaning section. In the cleaning section 105, residual foreign substances on the surface after the processing are washed away with cleaning water while the semiconductor substrate 1 is secured by vacuum and being rotated. Thereafter, the semiconductor substrate 1 is dried while the cleaning water is being blown away in a manner that the semiconductor substrate 1 is being rotated at a high speed while air is being blown thereto. After the completion of the drying, again the carrier hand takes out the semiconductor substrate 1 and houses it into the housing cassette 111 of the housing section 101.

The above-described steps are performed in a manner that the rear face is first cut with being secured at the face on which the bumps and the insulating film between the bumps are formed, and then the surfaces of the bumps and the surface of the insulating film are cut with reference to the rear face, thereby completing the planarization.

(Semiconductor Device and Method for Manufacturing the Same)

Next, a method for manufacturing a semiconductor device will be described using a semiconductor manufacturing apparatus which performs the above-described method for forming bumps. Note that a configuration of the semiconductor device will be discussed here together with the method for manufacturing the same.

Figure 9A:
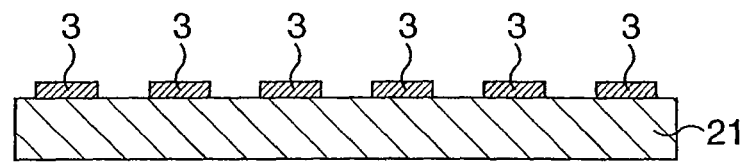
FIG. 9A to 9C are schematic cross-sectional views showing a method for manufacturing a semiconductor device according to a second embodiment in the order of steps.
Figure 9B:
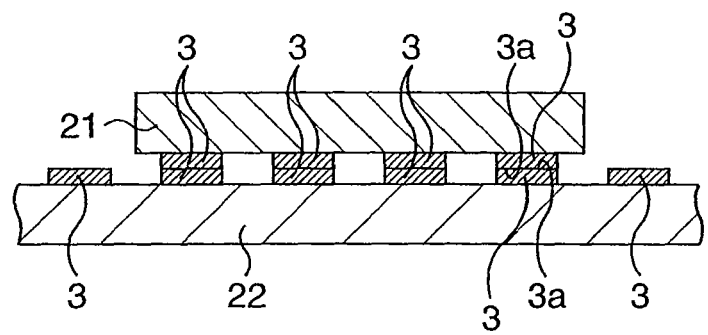
Figure 9C:
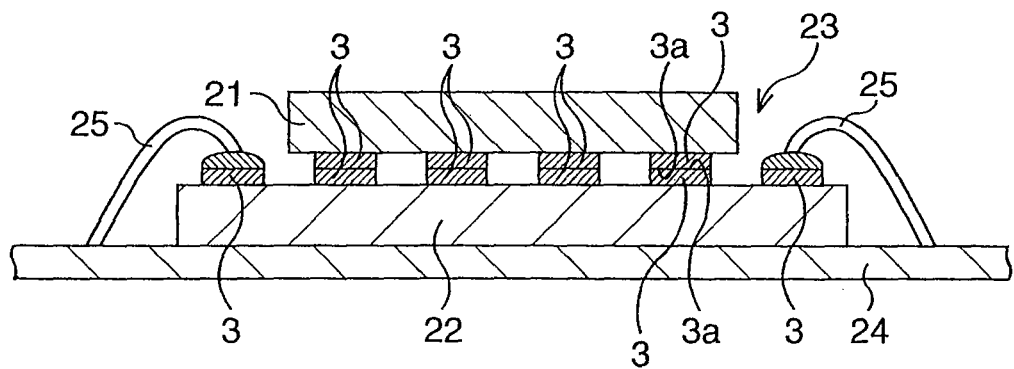

FIG. 9A to FIG. 9C are schematic cross-sectional views showing the method for manufacturing the semiconductor device according to this embodiment in the order of steps.

First, as shown in FIG. 9A, each semiconductor chip 21 is cut out from a semiconductor substrate 1 which has LSI elements and the like mounted thereon and bumps 3 with top surfaces 3a planarized by cutting using a tool, after undergoing the respective steps illustrated in FIGS. 1A to 1D and FIGS. 2A and 2B.

Subsequently, as shown in FIG. 9B, a semiconductor substrate 22 having bumps 3 with top surfaces planarized by the cutting using the tool is prepared, and semiconductor chips 21 are electrically connected onto the semiconductor substrate 22 through the respective planarized top surfaces 3a of the bumps 3. Specifically, the semiconductor substrate 22 and a semiconductor chip 21a are arranged to oppose each other at the respective top surfaces 3a and connected with each other by pressure-bonding at room temperatures to 350° C., about 170° C. here. Since both of the respective top surfaces 3a are planarized with high accuracy, the semiconductor substrate 22 and the semiconductor chip 21 can be easily connected with each other, unlike the conventional art, without requiring a high temperature, a high pressure, and so on.

Then, as shown in FIG. 9C, semiconductor chips 23 are cut, on a chip by chip bases, from the semiconductor substrate 22 with which the semiconductor chips 21 are connected, and undergo steps such as the wire bonding method (connection using wires 25) and so on. Then, the semiconductor chip 23 is mounted on a substrate 24, thereby completing a semiconductor device.

As described above, according to this embodiment, in place of the CMP, it becomes possible to planarize the surfaces of the fine bumps 3 formed on the semiconductor substrate 1 at a low cost and a high speed without causing inconvenience such as dishing or the like, and to establish the connection of the bumps 3 easily and securely. This enables the connection between the bumps 3, without requiring conditions such as a high temperature, a high pressure, and so on, so that reliable semiconductor devices can be manufactured with high yields.

[Second Embodiment]

Next, a second embodiment will be described. Although Au is illustrated as an example of the bump material in the first embodiment, the case of using nickel (Ni) is illustrates in this embodiment.

FIG. 10A to FIG. 10F are schematic cross-sectional views showing a method for forming bumps according to this embodiment in the order of steps.

First, through steps similar to those in FIGS. 1A and 1B of the first embodiment, a rear face of a semiconductor substrate 1 is cut so that the TTV is controlled to be a predetermined value or less, specifically, 1 µm or less.

Figure 10A:
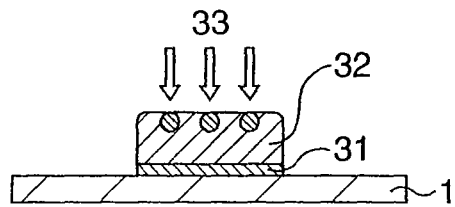
FIG. 10A to FIG. 10F are schematic cross-sectional views showing a method for forming bumps according to the second embodiment in the order of steps.

This semiconductor substrate 1 is used, and an electrode 31 made of an aluminum-based metal is pattern-formed on the front face of the semiconductor substrate 1, and then a nickel-phosphorous plating film 32 is formed in a thickness of about 5 µm to about 10 µm on the electrode 31 by an electroless plating method as shown in FIG. 10A.

The nickel-phosphorous plating film 32 is formed by a general electroless plating method using nickel-phosphor, nickel-phosphor-boron, nickel-boron, or the like. For example, a nickel-phosphor alloy is formed in a bath of hypophosphite (sodium hypophosphite or potassium hypophosphite), a nickel-boron alloy is formed in a bath of sodium borohydride or in a weakly acidic bath or a neutral bath using dimethylaminoborane, and a nickel-phosphor-boron alloy is formed in a neutral bath.

Here in the nickel-phosphor-based electroless plating, a phosphor concentrated layer 33 being a mechanically vulnerable layer is formed in the surface layer of the nickel-phosphorous plating layer 32 even if any of the above-described alloys is selected. After the formation of a solder bump, this phosphor concentrated layer causes a decrease in strength of an interface between the plating and the solder bump. The thickness of the phosphor concentrated layer is about 20 nm to about 40 nm, and increases with an increase in phosphor content in the plating bath.

Further, the phosphor concentrated layer is created independent of the material of a base (a glass substrate, an iron substrate, or an aluminum substrate) and of the thickness of the plating. In addition, the phosphor concentrated layer is necessarily formed in the surface layer even through the nickel-based electroless plating is subjected to annealing processing at a solder melting point or higher as described in, for example, Patent Document 6. Unless the phosphor concentrated layer is removed, it is difficult to form reliable plating coating and solder bump.

An approach to these problems is a method of forming a copper-nickel-silver-based compound layer by adding copper to a solder material and using its barrier effect to restrain the formation of the phosphor concentrated layer. However, there is a problem of formation of the phosphor concentrated layer when the thickness of the Au plating is 500 nm more, which leads to restriction on the Au plating thickness and narrower selectivity of the solder material.

Hence, in this embodiment, during the planarization by the cutting of the nickel-phosphorous plating film 32, the phosphor concentrated layer 33 is removed concurrently.

Figure 10B:
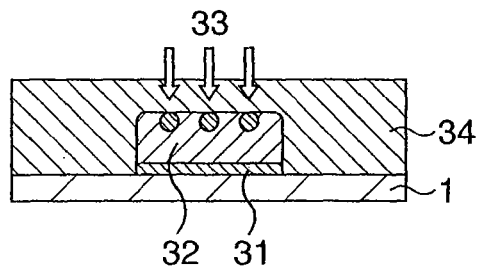

Specifically, first, as shown in FIG. 10B, a liquid resist is applied as a protective film 34 to cover the front face of the substrate to form a shock absorbing layer against a physical shock caused by the later-described cutting. The protective film 34 is formed by applying the resist in a thickness of about 10 µm to about 15 µm by spin coating or the like and curing it.

Figure 10C:
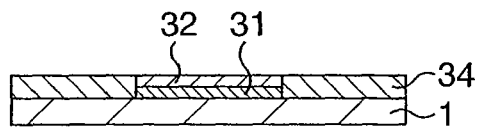

Thereafter, similarly to FIG. 2A, the rear face is sucked, for example, by vacuum suction to the supporting face of the substrate supporting table, whereby the semiconductor substrate 1 is secured to the substrate supporting table. In this event, the thickness of the semiconductor substrate 1 is fixed by the planarization in FIG. 1B on the rear face 1b, and further the rear face 1b is forcibly brought into a state free from undulation and the like because of the suction to the supporting face 11a, whereby the rear face 1b becomes a reference face for the planarization of the front face 1a. In this state, as shown in FIG. 10C, machining, that is, cutting using a tool made of diamond or the like here, is performed for the surface layers of each nickel-phosphorous plating film 32 and the protective film 34 on the front face 1a to remove the phosphor concentrated layer 33 of the nickel-phosphorous plating film 32 and to perform planarization so that the surfaces of the nickel-phosphorous plating film 32 and the protective film 34 become continuously flat. The amount of cutting is set to about 1 µm to about 2 µm with which the phosphor concentrated layer 33 can be surely removed.

Figure 10D:
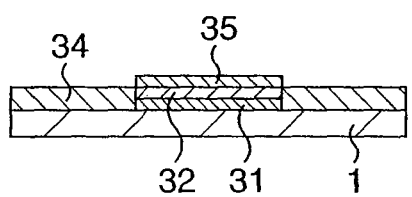

Subsequently, as shown in FIG. 10D, a gold plating film 35 is formed on the nickel-phosphorous plating film 32 as required by the electroless plating method. The thickness of the gold plating film 35 preferably ranges from about 30 nm to about 50 nm.

Figure 10E:
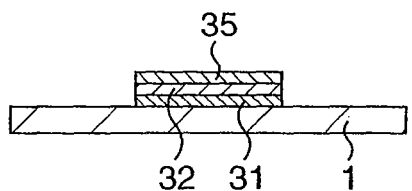

Subsequently, as shown in FIG. 10E, the protective film 34 is removed by ashing or the like. In this event, on the front face 1a of the semiconductor substrate 1, bumps 36 are formed which have a uniform thickness and top surfaces uniformly planarized by the cutting and in which the gold plating films 35 are formed.

Figure 10F:
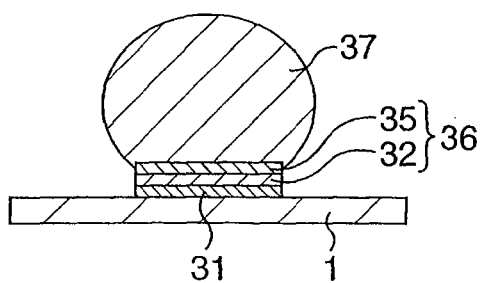

Then, as show in FIG. 10F, a solder bump 37 is formed on the bump 36 when necessary. This solder bump 37 is formed by the screen printing, solder ball method, melting, or the like. It is preferable to use, as the material of the solder, a tin-silver-based, or tin-zinc-based solder or the like which contains no lead.

Then, the semiconductor substrate 1 is divided by full-cut dicing, thereby cutting out semiconductor chips to complete semiconductor devices as in the first embodiment.

As described above, according to this embodiment, in place of the CMP, it becomes possible to planarize the surfaces of the nickel bumps 36 formed on the semiconductor substrate 1 at a low cost and a high speed without causing inconvenience such as dishing or the like. This enables the connection between the bumps 36, without requiring conditions such as a high temperature, a high pressure, and so on, so that reliable semiconductor devices can be manufactured with high yields. In addition, the phosphor concentrated layer 34 which degrades the reliability in a joint between the bump 36 and the solder bump 37 can be completely removed at a low cost, thus allowing the solder bump 37 to be surely formed on the bump 36 having the planarized top surface.

[Third Embodiment]

Next, a third embodiment will be described. Although the case in which a number of semiconductor chips are joined to the semiconductor substrate is illustrated in the first embodiment, this embodiment discloses the case in which the above-described planarization is performed on the semiconductor chips and the semiconductor chips are joined together.

FIG. 11A and FIG. 11B are schematic cross-sectional views showing a method for manufacturing a semiconductor device according to this embodiment in the order of steps.

First, as shown in FIG. 11A, an individual semiconductor chip 41 is cut out, without performance of the rear face cutting in the first embodiment, from a semiconductor substrate on which LSI elements and the like are mounted and a plurality of bumps different in height (still having variations in height), Au bumps 42 here, are formed.

Subsequently, machining, that is, cutting using a tool made of diamond or the like here, is performed on the surface layer of the semiconductor chip 41 to thereby perform planarization so that the surfaces of the Au bumps 42 become continuously flat. This makes the Au bumps 42 uniform in height and planarizes their tops surfaces into mirror surfaces.

Subsequently, as shown in FIG. 11B, a pair of semiconductor chips 41 are arranged to oppose each other and electrically connected via the planarized top surfaces of the Au bumps 42. Specifically, the pair of semiconductor chips 41 are placed to oppose each other at the top surfaces and connected with each other by pressure-bonding at room temperatures to 350° C., about 170° C. here. Since both of the top surfaces are planarized with high accuracy, the pair of semiconductor chips 41 can be easily connected, unlike the conventional art, without requiring a high temperature, a high pressure, and so on.

As described above, according to this embodiment, in place of the CMP, it becomes possible to planarize the surfaces of the fine Au bumps 42 formed on the semiconductor chip 41 at a low cost and a high speed without causing inconvenience such as dishing or the like, and to establish the connection between the Au bumps 42 in the pair of semiconductor chips 41 easily and securely. This enables the connection between the Au bumps 42, without requiring conditions such as a high temperature, a high pressure, and so on, so that reliable semiconductor devices can be manufactured with high yields. In addition, the performance of the above-described cutting after the cutting out of the individual semiconductor chip 41 from the semiconductor substrate can omit the step of controlling the TTV, thereby contributing to a reduction in the number of steps.

[Modification 1]

Here Modification 1 of this embodiment is described.

Figure 12A:
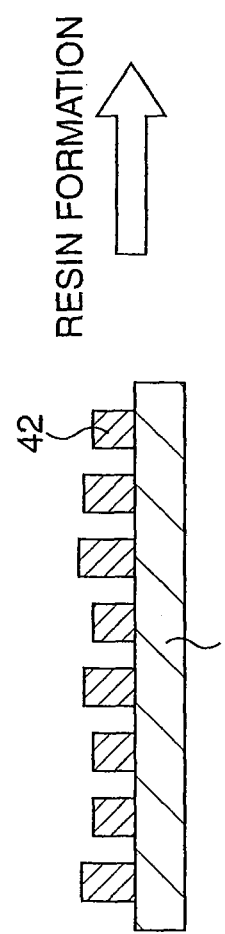
Figure 12B:
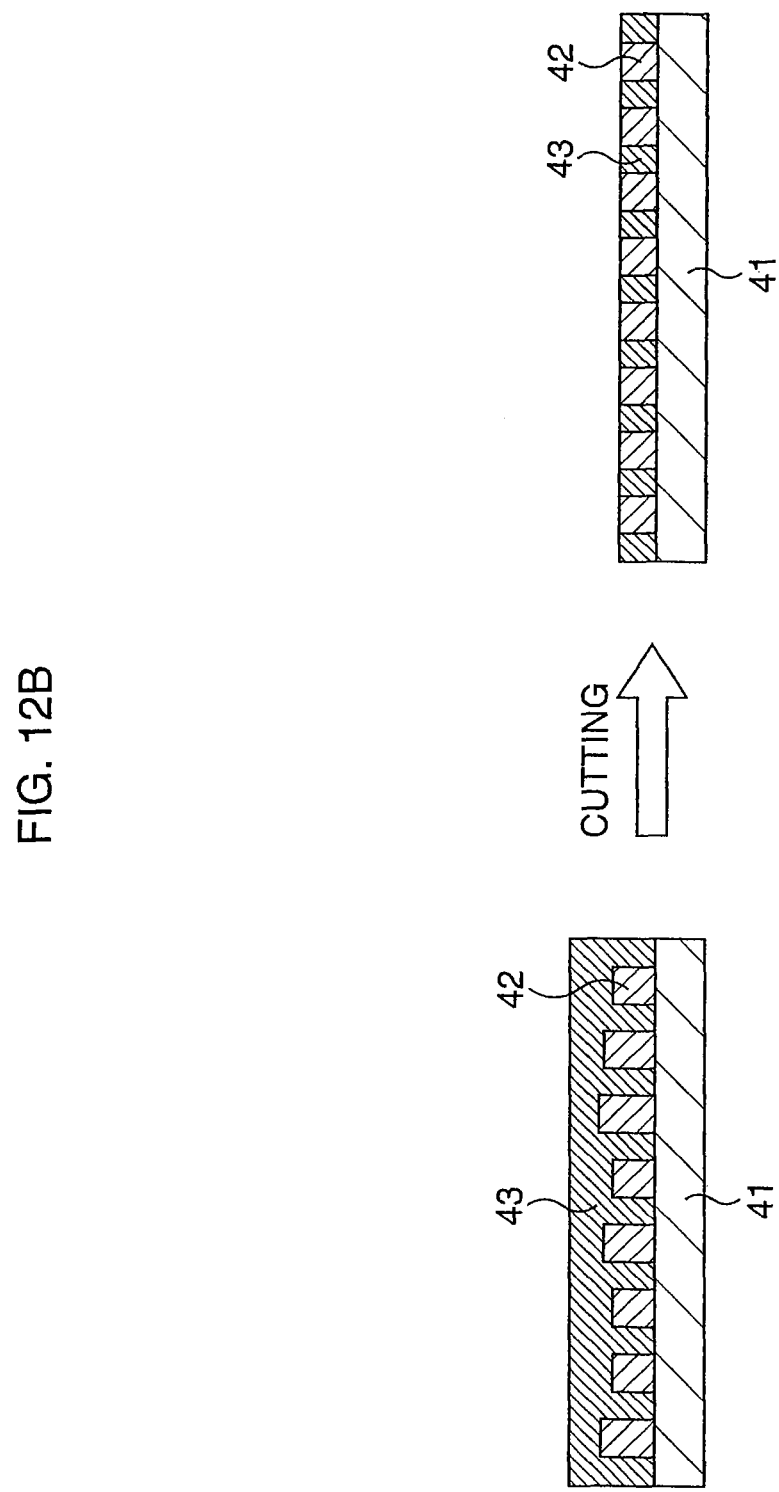

FIG. 12A to FIG. 12C are schematic cross-sectional views showing a method for manufacturing a semiconductor device according to Modification 1 in the order of steps.

First, as shown in FIG. 12A, an individual semiconductor chip 41 is cut out, without performance of the rear face cutting in the first embodiment, from a semiconductor substrate on which LSI elements and the like are mounted and a plurality of bumps different in height (still having variations in height), Au bumps 42 here, are formed.

Subsequently, a resin layer 43 made of an insulating material is formed on the front face of the semiconductor chip 41 to bury the Au bumps 42. Note that the individual semiconductor chip 41 may be cut out after the resin layer 43 is formed to bury the Au bumps 42 in the state of the semiconductor substrate.

Subsequently, as shown in FIG. 12B, machining, that is, cutting using a tool made of diamond or the like here as in the first embodiment, is performed for the surface layer of the semiconductor chip 41 to thereby perform planarization so that the surfaces of the Au bumps 42 and the surface of the resin layer 43 become continuously flat. This makes the Au bumps 42 uniform in height and planarizes their top surfaces into mirror surfaces.

Subsequently, a pair of semiconductor chips 41 are arranged to oppose each other and electrically connected via the planarized top surfaces of the Au bumps 42 and the resin layers 43. Specifically, the pair of semiconductor chips 41 are placed to oppose each other at the top surfaces and connected with each other by pressure-bonding at room temperatures to 350° C., about 170° C. here. Since both of the top surfaces are planarized with high accuracy, the pair of semiconductor chips 41 can be easily connected, unlike the conventional art, without requiring a high temperature, a high pressure, and so on. Further, the resin layers 43 ensure joining of the pair of semiconductor chips 41 and contribute as an underfill which protects the electrodes 42 and so on.

As described above, according to this Modification 1, in place of the CMP, it becomes possible to planarize the surfaces of the fine Au bumps 42 formed on the semiconductor chip 41 at a low cost and a high speed without causing inconvenience such as dishing or the like, and to establish the connection between the Au bumps 42 in the pair of semiconductor chips 41 easily and securely. This enables the connection between the Au bumps 42, without requiring conditions such as a high temperature, a high pressure, and so on, so that reliable semiconductor devices can be manufactured with high yields. In addition, the performance of the above-described cutting after the cutting out of the individual semiconductor chip 41 from the semiconductor substrate can omit the step of controlling the TTV, thereby contributing to a reduction in the number of steps.

[Modification 2]

Next, Modification 2 of this embodiment is described.

Figure 13C:
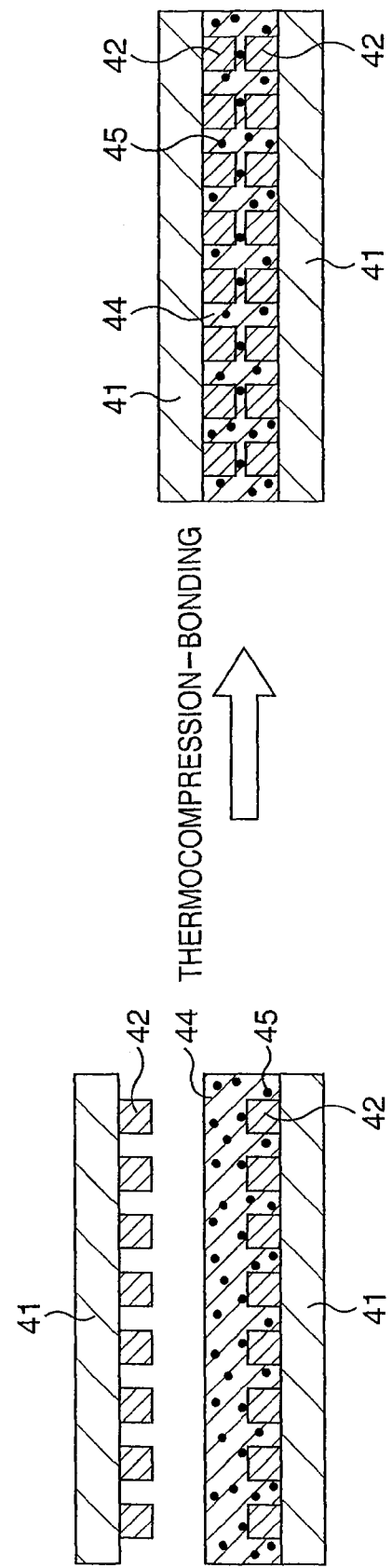

FIG. 13A to FIG. 13C are schematic cross-sectional views showing a method for manufacturing a semiconductor device according to Modification 2 in the order of steps.

First, as shown in FIG. 13A, an individual semiconductor chip 41 is cut out, without performance of the rear face cutting in the first embodiment, from a semiconductor substrate on which LSI elements and the like are mounted and a plurality of bumps different in height (still having variations in height), Au bumps 42 here, are formed.

Subsequently, machining, that is, cutting using a tool made of diamond or the like here as in the first embodiment, is performed for the surface layer of the semiconductor chip 41 to thereby perform planarization so that the surfaces of the Au bumps 42 become continuously flat. This makes the Au bumps 42 uniform in height and planarizes their top surfaces into mirror surfaces.

Subsequently, as shown in FIG. 13B, two semiconductor chips 41 which have been subjected to the planarization are made into a pair of semiconductor chips 41, and a resin layer 44 containing conductive fine particles 45 in an insulating resin is formed on the front face of one of the semiconductor chips 41 in a thickness to completely bury the Au bumps 42.

Subsequently, the pair of semiconductor chips 41 are arranged to oppose each other and electrically connected via the planarized top surfaces of the Au bumps 42. Specifically, the pair of semiconductor chips 41 are placed to oppose each other at the top surfaces and connected with each other by pressure-bonding at room temperatures to 350° C., about 170° C. here. Here the opposing Au bumps 42 are brought into contact with each other through the conductive fine particles 45 due to the thermocompression-bonding to be electrically connected. Since both of the top surfaces are planarized with high accuracy, the pair of semiconductor chips 41 can be easily connected, unlike the conventional art, without requiring a high temperature, a high pressure, and so on. Further, the resin of the resin layer 44 ensures the adhesiveness and electrical connection between the pair of semiconductor chips 41 and contributes as an underfill which protects the electrodes 42 so on.

As described above, according to this Modification 2, in place of the CMP, it becomes possible to planarize the surfaces of the fine Au bumps 42 formed on the semiconductor chip 41 at a low cost and a high speed without causing inconvenience such as dishing or the like, and to establish the connection between the Au bumps 42 in the pair of semiconductor chips 41 easily and securely. This enables the connection between the Au bumps 42, without requiring conditions such as a high temperature, a high pressure, and so on, so that reliable semiconductor devices can be manufactured with high yields. In addition, the performance of the above-described cutting after the cutting out of the individual semiconductor chip 41 from the semiconductor substrate can omit the step of controlling the TTV, thereby contributing to a reduction in the number of steps.

[Fourth Embodiment]

Next, a fourth embodiment will be described. Although the case in which the bumps for external connection are formed on the semiconductor substrate is illustrated in the first embodiment, this embodiment discloses the case in which stud bumps are formed using the wire bonding method.

FIG. 14A to FIG. 14F are schematic cross-sectional views showing a method for manufacturing a semiconductor device according to this embodiment in the order of steps.

Figure 14A:
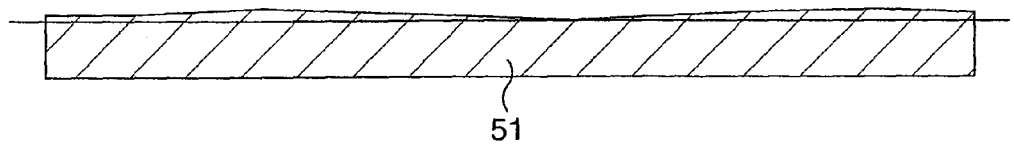
FIG. 14A to FIG. 14F are schematic cross-sectional views showing a method for manufacturing a semiconductor device according to a fourth embodiment in the order of steps.
Figure 14B:
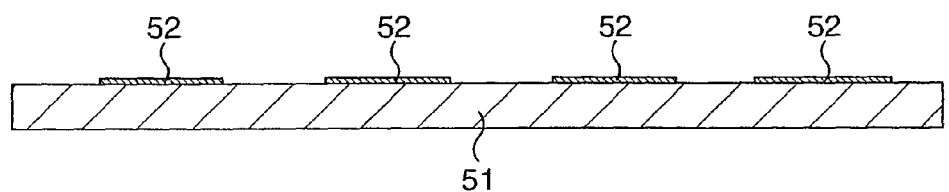

First, as shown in FIG. 14A and FIG. 14B, a rear face of a semiconductor substrate 51 on which LSI elements, electrode pads, and so on are formed within element formation regions as in FIG. 1A is cut so that the thickness of the semiconductor substrate 51 is controlled to become fixed, specifically the TTV (the difference between a maximum thickness and a minimum thickness of the substrate) being 1 µm or less.

Here, in the above-described cutting step, it is also suitable to form a metal film, for example, an Al film on the semiconductor substrate 51 by the sputtering method or the like after the cutting of the rear face of the semiconductor substrate 51, and patterning the Al film to thereby form electrode pads 52 at regions which will be electrical connecting points.

Figure 14C:
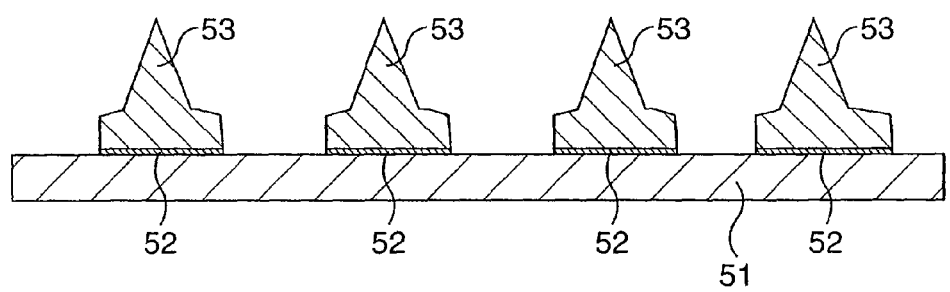

Subsequently, as shown in FIG. 14C, the wire bonding method using Au as metal is used to form Au projections 53 on the electrode pads 52 by pressure-bonding onto the electrode pads 52 a mass in a ball shape of a Au bonding wire having a diameter of, for example, 20 µm formed by melting its tip and then tearing off (precutting) the wire. In this event, the height of each Au projection 53 from the electrode pad 52 is defined to be double or more the diameter of the bonding wire, about 60 µm here. In this case, the Au projections 53 actually vary in height, and they only need to range from about 50 µm to about 60 µm.

Figure 14D:
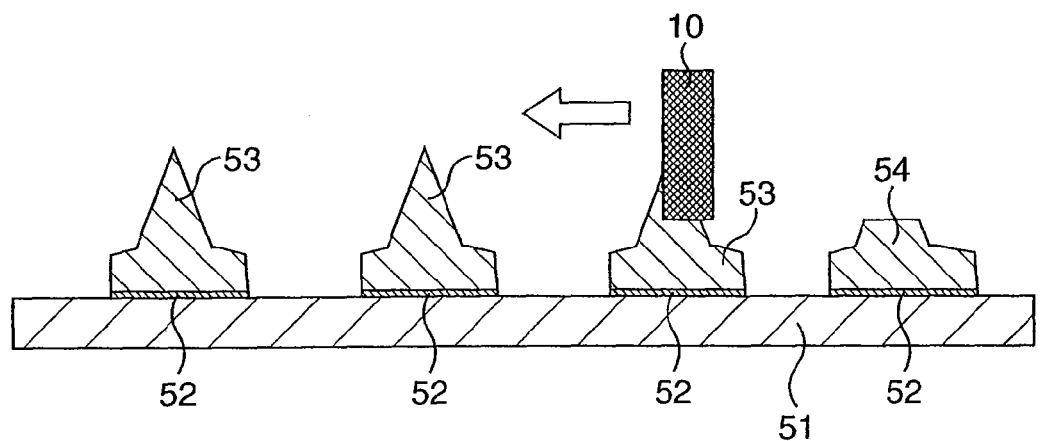
Figure 14E:
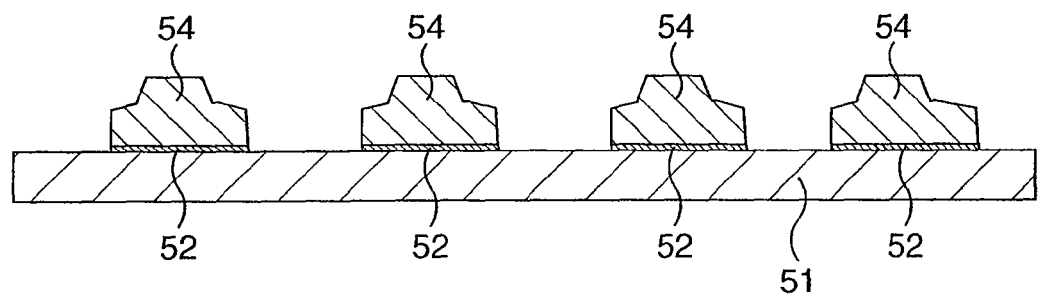

Subsequently, as shown in FIG. 14D, cutting is performed using a tool 10 made of diamond or the like, thereby performing planarization so that the top surfaces of the Au projections 53 become continuously flat to thereby form stud bumps 54. Here the cutting position is set at a height of, for example, about 50 µm from the electrode pad 52. Under the cutting conditions set such that the cutting speed is 10 m/s and the advance per cutting is 20 µm, the tool 10 is driven from the initial cutting position by 2 µm. This planarizes the top surfaces of the Au projections 53 into mirror surfaces as shown in FIG. 14E, thus forming the stud bumps 54.

This planarization method by the cutting costs low relative to the CMP because no slurry or the like is required and the tool being a cutting tool, even though having worn, can be applied to repeated use by grinding it. Since the semiconductor substrate chucked on the chuck table is rotated at a high speed, and the tool is moved on the semiconductor substrate at a predetermined speed to cut an arbitrary cutting amount at a time, the cutting can be finished in one to two minutes per semiconductor substrate, thus realizing a method with a very high throughput. In the cutting through use of the tool, it is possible to perform flattening on the projections or the like of the stud bumps using the Au bonding wire without tilt or breakage even when the projections are cut at tip portions, by appropriately setting the cutting conditions. However, since the projection may tilt during the cutting at a hardness of 30 Hv or lower, the hardness of the wire is preferably 30 Hv or higher.

In this embodiment, the point of time when the diameters of the cut faces of all of the stud bumps become equal to or larger than the wire diameter is regarded as the end point of the cutting. Generally, the stud bumps after the precut greatly vary in height, and therefore it is difficult to verify the point of time when the diameters of the cut faces of all of the stud bumps become equal to or larger than the wire diameter. The suitable cutting method is one driving the tool by 1 µm to 3 µm from a point where it comes in contact with the highest bump to thereby expose all of cut faces by the tool, but it is inefficient to verify every time the cut face in a camera image or the like.

Figure 15A:
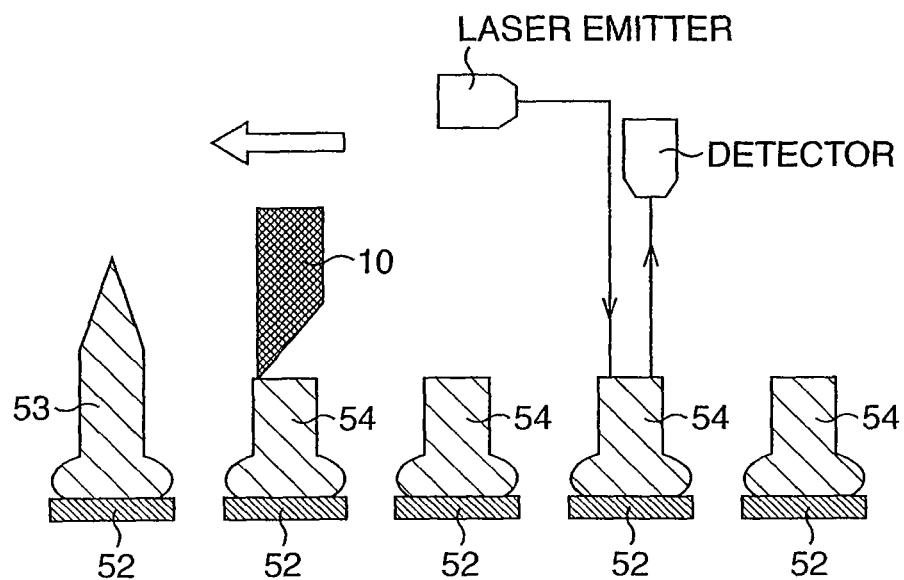
FIG. 15A to FIG. 15D are views showing a cutting end point detecting method according to the fourth embodiment.

Hence, this embodiment employs, as an end point detecting method, a method of sweeping a laser beam across the top surfaces of the stud bumps 54 after the cutting through use of a detecting apparatus including a laser emitter 61 and a detector 62, and detecting the laser reflected off the top surfaces by the detector 62, as shown in FIG. 15A.

Figure 15B:
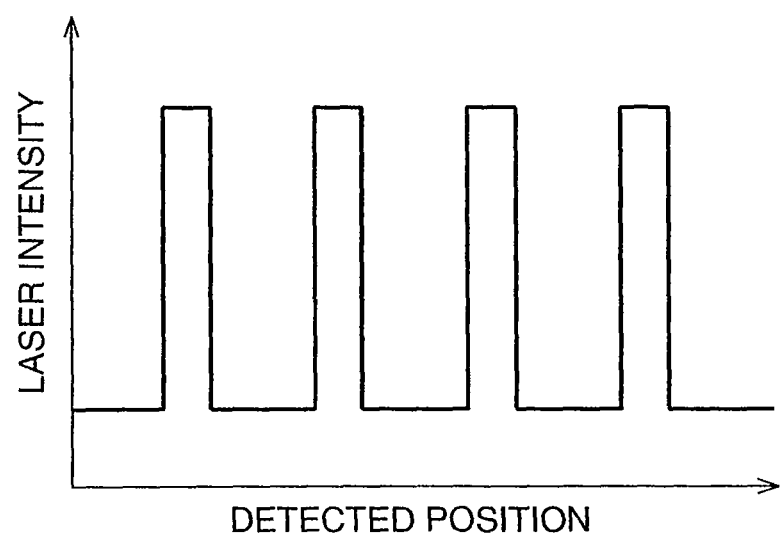

Then, the processing is repeated until after the detected laser intensity reaches a predetermined level at all of the Au projections 53 as shown in FIG. 15B. Preferably, this detecting apparatus is placed at a rear in the traveling direction of the cutting tool and travels in synchronism with the cutting tool. The top surfaces (cut faces) of the stud bumps 54 are formed into substantially mirror surfaces and thus totally reflect the laser light and the like. In the case in which the detecting apparatus is in synchronism with the cutting tool, all of the reflected light is not always detected, in the strict sense, because there occurs a delay in proportion to the traveling speed of the cutting tool, but substantially all of them may be assumed to be detected because the cutting speed is over 10 m/s at the highest.

In this embodiment, the detecting apparatus is driven while the laser emitter 61 and the detector 62, which move in synchronism with the travel of the tool and behind the tool, are measuring the intensity of the laser light reflected off the planarized top surfaces of the Au projections 53, so that when it detects that the top surfaces of all of the Au projections 53 are exposed at a height of, for example, 46 µm, the cutting is finished.

Figure 15C:
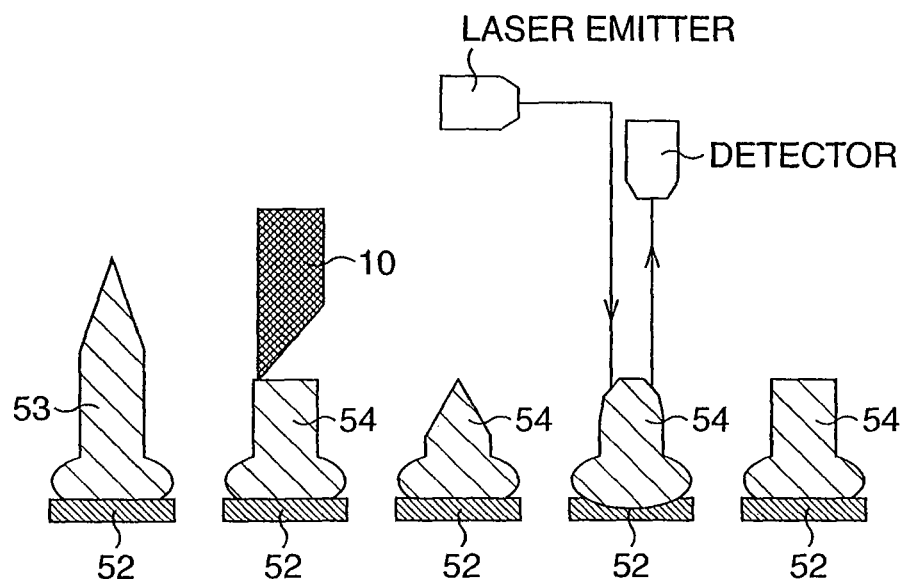
Figure 15D:
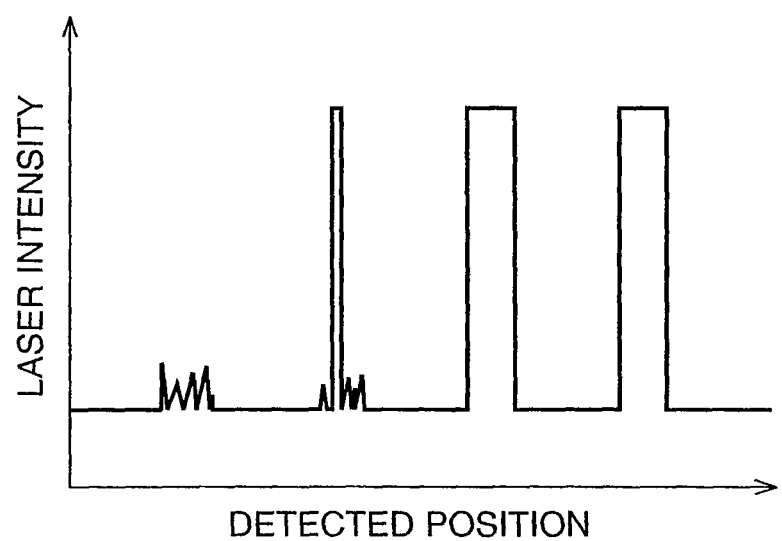

Here if the cutting is insufficient, or if the diameter of the cut face is equal to or less than the wire diameter as shown in FIG. 15C, the laser light impinging on a point other than the cut face reflects diffusely and is thus not detected by the detector. Therefore, as shown in FIG. 15D, the detected laser light intensity is weaker than that from the face which has been cut to have the same diameter as that of the bonding wire. If such a stud bump is found even at one point, the cutting tool is automatically driven to cut the bumps by about 1 µm to about 2 µm until after the laser intensity of a certain amount or more is finally detected at all of the bumps. This can prevent poor connection due to uncutting or insufficient cutting as well as substantially reduce the processing time.

Figure 14F:
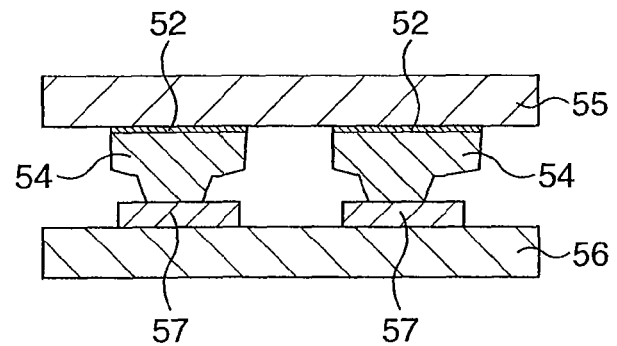

Then, as shown in FIG. 14F, each semiconductor chip 55 is cut out from the semiconductor substrate 51, and the semiconductor chip 55 is connected to a circuit board 56, for example, by the flip-chip method. Specifically, the stud bumps 54 with the planarized top surfaces on the semiconductor chip 55 and electrodes 57 formed on the front face of the circuit board 56 are arranged to oppose each other and brought into contact, and joined by pressure and heating. Note that, in this case, it is also preferable to planarize the electrodes 57 on the circuit board 56 by the above-described cutting similarly to the stud bumps 54 and then flip-chip connect them.

As described above, according to this embodiment, in place of the CMP, it becomes possible to planarize the surfaces of the fine stud bumps 54 formed on the semiconductor substrate 51 at a low cost and a high speed without causing inconvenience such as dishing or the like, and to establish the connection between the stud bumps 54 easily and securely. This enables the connection between the bumps without requiring conditions such as a high temperature, a high pressure, and so on, so that reliable semiconductor devices can be manufactured with high yields. In addition, the height of the stud bumps 54 after the cutting planarization can be made 1.5 times or more that when the wire diameter is not defined, thereby making it possible to mitigate the stress on the semiconductor device, resulting in increased device life. Furthermore, since the flat face created in the cutting has a diameter equal to or larger than the wire diameter, a joining strength of twice or more that in the conventional art can be obtained even with the same wire diameter. Further, if only the joining strength at the same level as that in the conventional art is required, the wire diameter can be decreased, so that the bump pitch can be decreased as well as the cost associated with the bonding wire can be reduced.

[Fifth Embodiment]

Next, a fifth embodiment will be described. Here a semiconductor device by a so-called TAB bonding method is exemplified.

Figure 16:
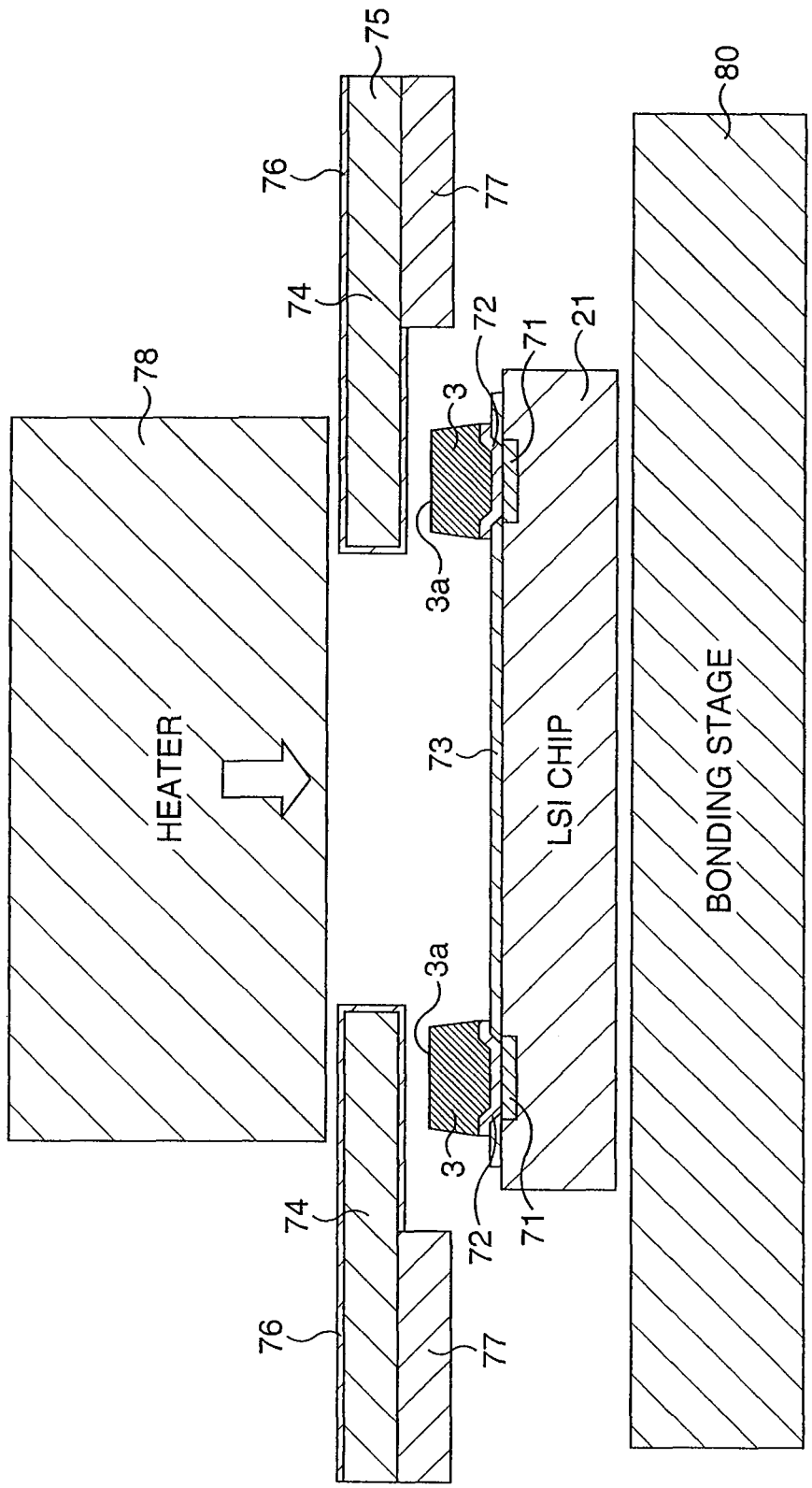
FIG. 16 is a schematic cross-sectional view showing a method for manufacturing a semiconductor device according to a fifth embodiment.
Figure 17:
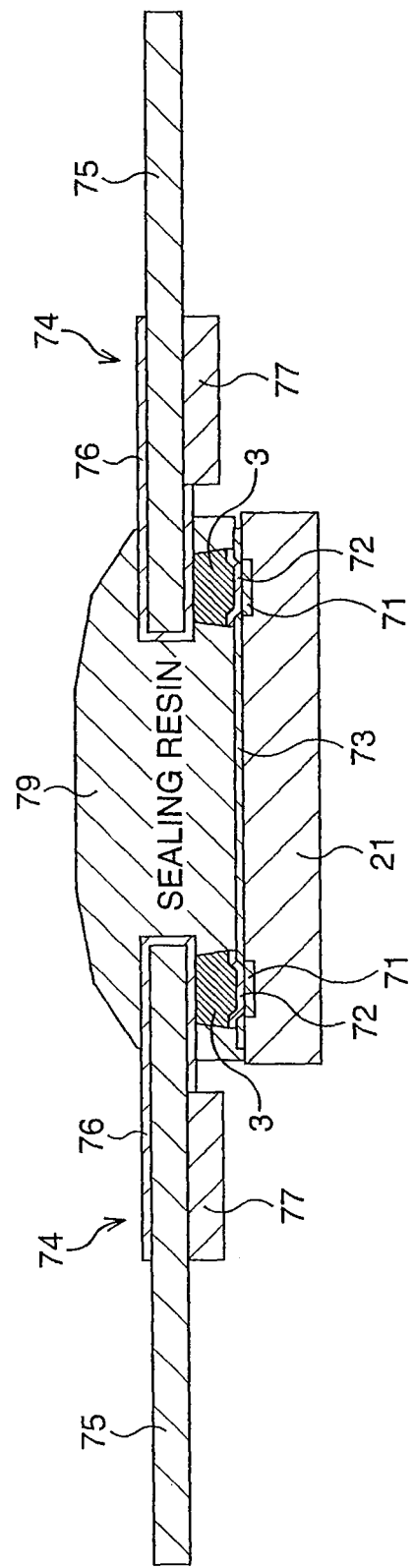
FIG. 17 is a schematic cross-sectional view showing the method for manufacturing a semiconductor device according to the fifth embodiment.

FIG. 16 and FIG. 17 are schematic cross-sectional views showing a method for manufacturing a semiconductor device according to this embodiment.

To manufacture this semiconductor device, first, through the various steps shown in FIGS. 1A to 1D and FIGS. 2A and 2B as in the first embodiment, bumps 3, which have a uniform height and uniformly planarized top surfaces 3a created by cutting Au projections 2, are formed via base metal films 72 on electrodes 71 of a semiconductor substrate 1 on which LSI semiconductor elements and so on are formed within element formation regions. Here an insulating protective film 73 is formed around the bumps 3 on the semiconductor substrate 1.

Subsequently, a probe is brought into contact with the top surface of the bump 3 to thereby inspect electrical characteristics of the semiconductor element and the like on the semiconductor substrate 1. Here the probe is brought into contact with depressions and projections on the bump or a plating end face where contamination exists to fail to obtain a stable contact in the inspection in the conventional art, leading to a trouble in which the tip of the probe is caught in the depressions and projections to break. In contrast, in this embodiment, the probe is brought into contact with the surface of the bump 3 which has been planarized by the above-described cutting to a high level and cleaned, so that the inspection can be conducted in a very stable state.

Subsequently, an individual semiconductor chip 21 is cut out from the semiconductor substrate 1, and then connection of the semiconductor chip 21 is established by the TAB bonding method as shown in FIG. 16.

Specifically, TAB leads 74 are prepared each of which is made of a copper foil 75 on which a Au film 76 is formed by surface treatment with Au and has a portion located at one end corresponding to the connecting region and a resin layer 77 provided at the other end. The semiconductor chip 21 is then securely mounted on a bonding stage 80, and the Au films 76 of the TAB leads 74 within the connecting regions are brought into contact with the planarized and cleaned top surfaces of the bumps 3 on the semiconductor chip 21, and a pressure is applied while a heater 78 is heating them to thereby join them. Here the heating temperature may be relatively low, such as about 200° C., and the bonding load can also be reduced to about 20 g that is about ⅔ that in the conventional art. As a result, it becomes possible to connect the TAB leads with a fine pitch of 40 μm or less without positional displacement.

Thereafter, as shown in FIG. 17, the semiconductor chip 21 is detached from the bonding stage 80, and a sealing resin 79 is formed to cover the front face of the semiconductor chip 21 including the connecting regions between the bumps 3 and the TAB leads 74, thereby completing a semiconductor device.

Note that although the case in which the plated bumps are formed as bumps is illustrated in this embodiment, the stud bumps by the wire bonding method may be formed.

As described above, according to this embodiment, in place of the CMP, it becomes possible to planarize the surfaces of the fine bumps 3 formed on the semiconductor substrate 1 at a low cost and a high speed without causing inconvenience such as dishing or the like, and to establish the connection of the bumps 3 easily and securely. This enables secure connection between the bump and a lead terminal without requiring conditions such as a high temperature, a high pressure, and so on, so that reliable TAB bonding-type semiconductor devices can be manufactured with high yields.

[Sixth Embodiment]

Next, a sixth embodiment will be described. Here an apparatus configuration is disclosed for performing the above-described cutting step and joining step on a pair of bases (a semiconductor chip and a circuit board by the flip-chip method is exemplified here) in performing the above-described various embodiments.

Figure 18:
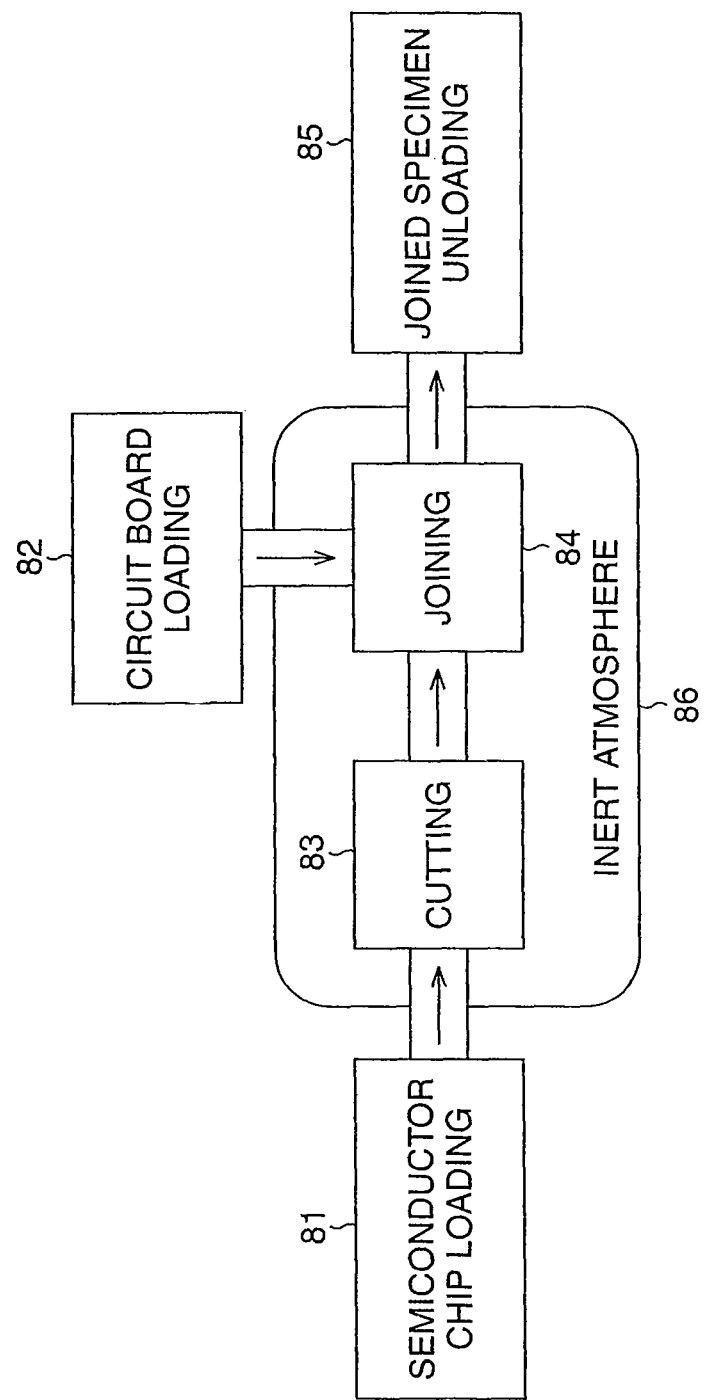
FIG. 18 is a schematic diagram showing a semiconductor manufacturing apparatus according to a sixth embodiment.

FIG. 18 is a schematic diagram showing a semiconductor manufacturing apparatus according to this embodiment.

This semiconductor manufacturing apparatus comprises a chip introduction section 81 for introducing a semiconductor chip with bumps formed on its front face; a circuit board introduction section 82 for introducing a circuit board with electrodes formed on its front face; a cutting section 83 performing a step of planarizing the surfaces of the bumps on the semiconductor chip by the above-described cutting using a tool; a joining section 84 performing a step of joining the semiconductor chip and the circuit board via the planarized bumps and the electrodes; and a carry-out section 85 for carrying out a joined and integrated semiconductor device, and further has a cleaning holding section 86 including the cutting section 83 and the joining section 84 in an inert atmosphere. Here in the cutting section 83, not only the semiconductor chip but also the surfaces of the electrodes on the circuit board may be similarly planarized by the cutting.

The cleaning holding section 86 has a function of holding a cleaning atmosphere, specifically, an inert atmosphere, for example, a gas phase not containing Ar, $N_2$, or the like, or an atmosphere at 1 atm or less containing oxygen, in the planarizing step and the joining step. This can relatively easily hold a planarization state very close to an ideal state without addition of a cleaning step using Ar plasma or the like immediately before the joining step, realizing secure joining between the bumps and the electrodes.

Note that the flip-chip mounting is illustrated in this embodiment, but the present invention is not limited to this and preferably used for joining a semiconductor chip and a semiconductor wafer, semiconductor chips, or the like.

INDUSTRIAL APPLICABILITY

According to the present invention, in place of the CMP, it becomes possible to planarize the surfaces of the fine bumps formed on the substrate at a low cost and a high speed, and to establish the connection between the bumps easily and securely without causing inconvenience such as dishing or the like.

What is claimed is:

1. A method for forming on a front face of a substrate bumps for establishing an electrical connection with an external part, said method comprising the steps of:
   forming the plurality of bumps and an insulating film between the bumps on the front face of the substrate;
   performing planarization by cutting using a tool so that surfaces of the bumps and a surface of the insulating film become continuously flat; and
   removing the insulating film;
   wherein the surfaces of the bumps are subjected to the cutting so that the bumps have the same height on the substrate;
   further comprising the step of:
   performing planarization by machining on a rear face of the substrate with securing the substrate at a front face side of the substrate,
   wherein the planarization of the surfaces of the bumps and the surface of the insulating film is performed with securing the substrate at a rear face of the substrate;
   wherein in performing planarization of the surfaces of the bumps and the surface of the insulating film, correction of parallelism of the semiconductor substrate is performed with reference to the rear face, and a position of the front face is detected, so that a cutting amount is calculated from the detected front face for control; and
   wherein in detecting the position of the front face of the substrate, laser light is applied to the insulating film at a plurality of points within a peripheral region of the front face to heat and scatter an insulator to thereby expose portions of the front face.

2. The method for forming bumps according to claim 1, wherein in forming the bumps, the insulating film is processed to form a mask having a plurality of openings in a form of electrodes, and then the openings of the mask are filled with a conductive material.

3. The method for forming bumps according to claim 2, wherein the openings of the mask are filled with the conductive material by a plating method.

4. The method for forming bumps according to claim 1, wherein the flattened bumps have the same height on the substrate.

5. The method for forming bumps according to claim 1, wherein in detecting the position of the front face of the substrate, infrared laser light is applied to the rear face and reflected light from the front face is measured.

* * * * *